(12) United States Patent
Hamada et al.

(10) Patent No.: US 8,015,985 B2
(45) Date of Patent: Sep. 13, 2011

(54) SUBSTRATE PROCESSING APPARATUS AND SUBSTRATE PROCESSING METHOD USING THE SAME

(75) Inventors: Tetsuya Hamada, Shimogyo-ku (JP); Koji Nishiyama, Shimogyo-ku (JP)

(73) Assignee: Sokudo Co., Ltd., Kyoto (JP)

( * ) Notice: Subject to any disclaimer, the term of this patent is extended or adjusted under 35 U.S.C. 154(b) by 369 days.

(21) Appl. No.: 12/349,356

(22) Filed: Jan. 6, 2009

(65) Prior Publication Data
US 2009/0173364 A1    Jul. 9, 2009

(30) Foreign Application Priority Data

Jan. 8, 2008    (JP) .................. 2008-001045

(51) Int. Cl.
*B08B 3/00* (2006.01)

(52) U.S. Cl. ....................... 134/99.1; 138/114
(58) Field of Classification Search .......... 134/99.1; 138/114
See application file for complete search history.

(56) References Cited

U.S. PATENT DOCUMENTS

| 6,276,378 B1 | 8/2001 | Taniyama et al. |
| 2006/0291855 A1 | 12/2006 | Shigemori et al. |

FOREIGN PATENT DOCUMENTS

| JP | 10-137664 | 5/1998 |
| JP | 11-067705 | 3/1999 |
| JP | 11-265868 | 9/1999 |
| JP | 2000-223460 | 8/2000 |

*Primary Examiner* — Michael Kornakov
*Assistant Examiner* — Samuel A Waldbaum
(74) *Attorney, Agent, or Firm* — Kilpatrick Townsend & Stockton LLP

(57) ABSTRACT

A fluid supply pipe is inserted through a motor supporting member, a spin motor, a rotating shaft, and a plate supporting member. A first flange is integrally formed in the vicinity of a curved portion of a straight portion, extending in the vertical direction, of the fluid supply pipe. The first flange is fixed to a motor supporting member. Thus, the fluid supply pipe is fixed to the spin motor through the motor supporting member. The fluid supply pipe has a configuration in which a gas supply pipe made of resin and a plurality of cleaning liquid supply pipes made of resin are accommodated inside a guide pipe made of stainless. Inside the guide pipe, the one gas supply pipe is surrounded by the plurality of cleaning liquid supply pipes.

5 Claims, 14 Drawing Sheets

F I G. 1
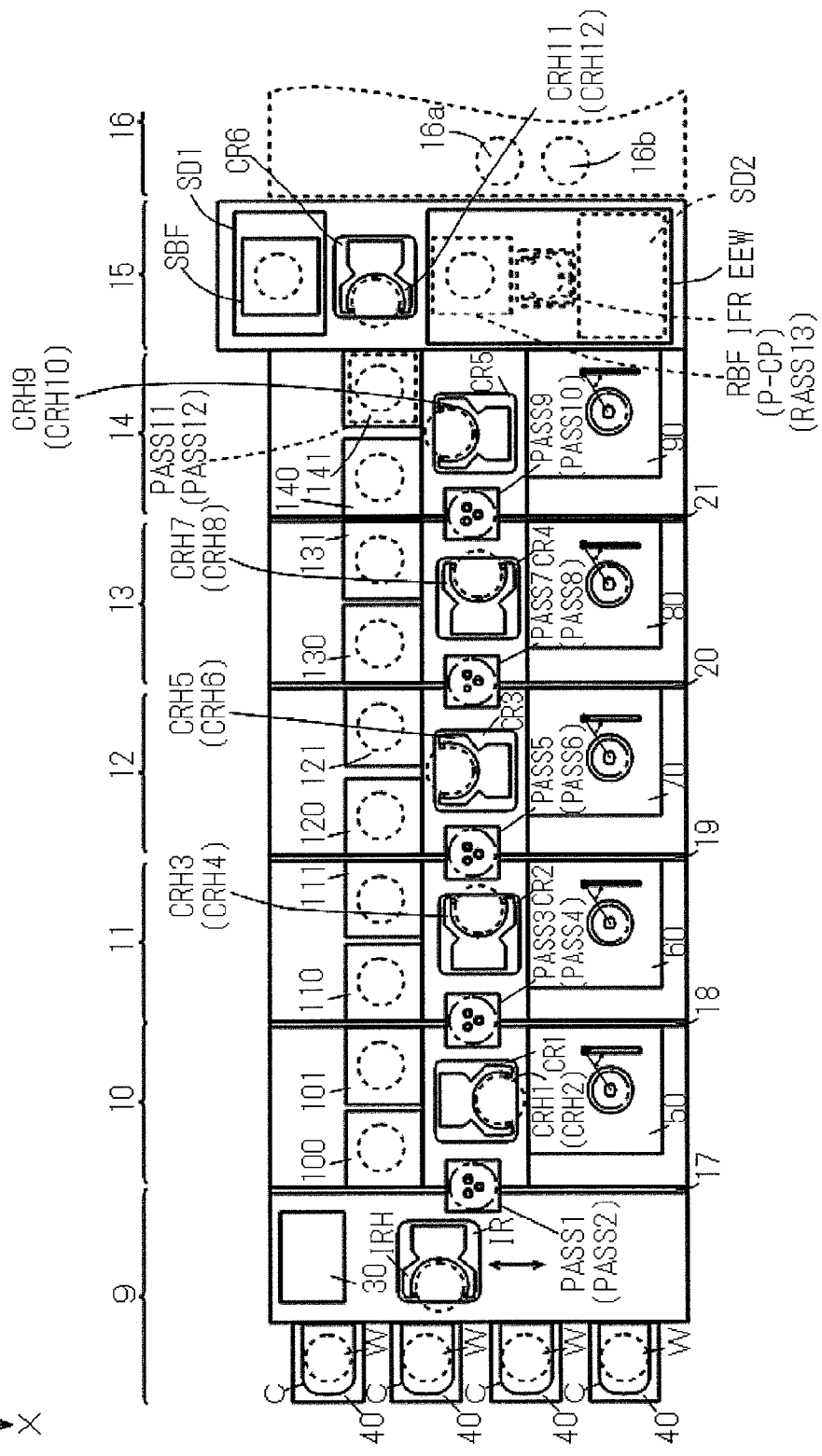

SUBSTRATE PROCESSING APPARATUS AND SUBSTRATE PROCESSING METHOD USING THE SAME

CROSS-REFERENCES TO RELATED APPLICATIONS

This application claims priority to Japanese Patent Application 2008-001045, filed Jan. 8, 2008. The disclosure of JP 2008-001045 is hereby incorporated by reference its entirety for all purposes.

BACKGROUND OF THE INVENTION

Field of the Invention

The present invention relates to a substrate processing apparatus that subjects substrates to various types of processing and a substrate processing method using the same.

Substrate processing apparatuses have been conventionally used to subject substrates such as semiconductor wafers, glass substrates for photomasks, liquid crystal displays, and optical disks to various types of processing.

In the substrate processing apparatuses, substrates held by spin chucks, for example, are rotated in horizontal attitudes. Cleaning liquids are supplied to top surfaces or back surfaces of the substrates that rotate, so that the substrates are subjected to cleaning processing. As an example of substrate processing apparatuses that perform such cleaning processing, a rotary substrate processing apparatus disclosed in JP 10-137664 A will be described.

FIG. 14 is a schematic view showing the configuration of the substrate processing apparatus disclosed in JP 10-137664 A. The rotary substrate processing apparatus includes a rotation holder (mechanical spin chuck) 901. The rotation holder 901 has a rotating member 902 in a circular disk shape. The rotating member 902 is horizontally fixed to an upper end of a shaft 904 extending upward from a motor 903 provided below. A plurality of holding pins 906 that hold a substrate W in a horizontal attitude are provided on an upper surface of the rotating member 902.

The shaft 904 extending from the motor 903 is composed of a hollow body, and a back rinse nozzle 907 for cleaning a back surface of the substrate W is inserted into the shaft 904. The back rinse nozzle 907 projects toward the back surface of the substrate W after penetrating a substantially central part of the rotating member 902.

A first discharge port 971 that discharges a cleaning liquid vertically upward is formed at an upper end of the back rinse nozzle 907. A second discharge port 972 that discharges a cleaning liquid sideward is formed on a peripheral wall in the vicinity of the upper end of the back rinse nozzle 907.

When the substrate W is subjected to back surface cleaning processing, an outer edge of the substrate W is held by the plurality of holding pins 906 on the rotating member 902. The motor 903 operates in this state so that the substrate W rotates. The cleaning liquid is supplied to the back surface of the substrate W from the back rinse nozzle 907.

The cleaning liquid discharged from the first discharge port 971 in the back rinse nozzle 907 flows outward along the back surface of the substrate W from the center of the substrate W by a centrifugal force. This causes the whole back surface of the substrate W to be cleaned.

After the substrate W is subjected to the cleaning processing, drying processing may, in some cases, be performed by supplying a gas to the top surface of the substrate W that has been subjected to the cleaning processing. In this case, the top surface of the substrate W is quickly and reliably dried.

In the rotary substrate processing apparatus disclosed in JP 10-137664 A, when a gas is supplied in addition to the cleaning liquid to the back surface of the substrate W, a gas supplying nozzle must be provided within the shaft 904.

When a gas supplying nozzle is newly provided within the shaft 904, the shaft 904 actually increases in diameter while the motor 903 increases in size. As a result, the whole substrate processing apparatus increases in size.

In the rotary substrate processing apparatus disclosed in JP 10-137664 A, when the cleaning liquid is supplied to an area shifted from the rotation center of the substrate W, the cleaning liquid flows outward without passing through the rotation center of the substrate W by a centrifugal force. In this case, the cleaning liquid is not supplied to the rotation center of the substrate W.

In order to supply the cleaning liquid to the whole back surface of the substrate W, therefore, the cleaning liquid must be discharged to the rotation center of the substrate W with high precision. When a plurality of nozzles are provided in the shaft 904, therefore, the processing precision of each of the nozzles and the positional precision of each of the nozzles within the shaft 904 must be sufficiently improved. Since difficulties are involved in work for attaching the plurality of nozzles in the shaft 904 with high precision, however, the manufacturing cost increases.

SUMMARY OF THE INVENTION

An object of the present invention to provide a substrate processing apparatus that can supply a plurality of types of fluids to a substrate with high precision and can be easily manufactured and can be miniaturized and a substrate processing method using the same.

(1) According to an aspect of the present invention, a substrate processing apparatus that subjects a substrate to predetermined processing includes a rotation-driving device having a hollow rotating shaft extending in the vertical direction, a rotating member attached to the rotating shaft so as to rotate together with the rotating shaft and having an opening at its center, a plurality of holding members that are provided in the rotating member and hold an outer edge of the substrate, and a fluid supplying mechanism that supplies a first fluid and a second fluid to one surface of the substrate held by the plurality of holding members. The fluid supplying mechanism includes an outer pipe made of metal that is inserted through the rotating shaft of the rotation-driving device and the opening of the rotating member and is supported on the rotation-driving device such that a predetermined gap is formed between the outer pipe and an inner peripheral surface of the rotating shaft. A first inner pipe made of resin is inserted into the center of the inside of the outer pipe and has a discharge port at its end opposed to the one surface of the substrate for supplying the first fluid to the substrate from the discharge port. A plurality of second inner pipes made of resin is inserted into a portion, around the first inner pipe, of the outer pipe in contact with an outer peripheral surface of the first inner pipe and an inner peripheral surface of the outer pipe and respectively have discharge ports at their ends opposed to the one surface of the substrate for supplying the second fluid to the substrate from the discharge ports.

In the substrate processing apparatus, the plurality of holding members provided in the rotating member hold the outer edge of the substrate. The rotating member is attached to the rotating shaft of the rotation-driving device. This causes the rotating member, together with the rotating shaft, to rotate by the rotation-driving device while causing the substrate held by the plurality of holding members to rotate.

The outer pipe made of metal in the fluid supplying mechanism is inserted through the rotating shaft of the rotation-driving device and the opening of the rotating member. The outer pipe is supported on the rotation-driving device such that the predetermined gap is formed between the outer pipe and the inner peripheral surface of the rotating shaft. The outer pipe made of metal has high rigidity. Even when the rotating shaft rotates, therefore, the gap between the outer pipe and the inner peripheral surface of the rotating shaft is kept constant.

The first inner pipe and the plurality of second inner pipes are inserted into the outer pipe. The first fluid is supplied from the discharge port at the end of the first inner pipe to the one surface of the substrate that rotates, or the second fluid is supplied thereto from the discharge ports at the ends of the plurality of second inner pipes. This causes the substrate to be processed.

Inside the outer pipe, the first inner pipe is inserted into the center thereof. Furthermore, the plurality of second inner pipes are inserted in contact with the outer peripheral surface of the first inner pipe and the inner peripheral surface of the outer pipe. This causes the first inner pipe to be positioned automatically and with high precision at the center of the inside of the outer pipe by the plurality of second inner pipes, while causing the plurality of second inner pipes to be positioned automatically and with high precision by the outer peripheral surface of the first inner pipe and the inner peripheral surface of the outer pipe. This allows the first fluid and the second fluid to be supplied to the center of the one surface of the substrate with high precision.

The outer pipe is supported on the rotation-driving device. Even when the rotation-driving device vibrates, therefore, the positional relationship between the rotating shaft and the outer pipe is held. This reliably prevents the outer pipe from coming into contact with the rotating shaft.

Furthermore, the first inner pipe made of resin and the plurality of second inner pipes made of resin have flexibility, so that the first inner pipe and the second inner pipes can be easily inserted into the outer pipe. Since the first inner pipe and the plurality of second inner pipes are inserted into the outer pipe, the fluid supplying mechanism becomes compact. Therefore, it becomes possible to miniaturize the substrate processing apparatus.

In addition, the fluid supplying mechanism can be easily assembled on the substrate processing apparatus by attaching to the rotation-driving device the outer pipe in which the first inner pipe and the plurality of second inner pipes have been inserted. Therefore, it becomes possible to easily manufacture the substrate processing apparatus.

(2) The substrate processing apparatus may further include a supporting member that supports the rotation-driving device such that the rotating shaft extends in the vertical direction, in which the outer pipe may have a flange, and the flange may be fixed to the supporting member.

In this case, the rotation-driving device is supported by the supporting member, and the flange of the outer pipe is fixed to the supporting member. This causes the outer pipe to be reliably fixed to the rotation-driving device through the flange and the supporting member. Thus attaching the flange of the outer pipe to the supporting member allows the fluid supplying mechanism to be easily fixed to the rotation-driving device. Therefore, it becomes easier to manufacture the substrate processing apparatus.

(3) The outer pipe may have an opening end opposed to the one surface of the substrate, and respective ends of the first inner pipe and the plurality of second inner pipes may project from the opening end of the outer pipe.

This prevents the first fluid and the second fluid supplied to the substrate from the discharge ports of the first inner pipe and the second inner pipes from adhering to the outer pipe made of metal. This prevents the first or second fluid that has adhered to the outer pipe from causing metal contamination in the substrate by dropping on the one surface of the substrate.

(4) The first fluid may be a gas, and the second fluid may be a processing liquid.

In this case, the processing liquid can be supplied from the discharge ports of the plurality of second inner pipes to the one surface of the substrate that rotates. Therefore, it becomes possible to quickly supply the large amount of processing liquid to the substrate. This allows a time period required to process the substrate to be shortened.

Supplying the gas to the one surface of the substrate that rotates causes the processing liquid that adheres to the one surface of the substrate to be quickly removed, allowing the substrate to be sufficiently and reliably dried.

Here, the first inner pipe is positioned at the center of the inside of the outer pipe, and the outer pipe is supported on the rotation-driving device such that the predetermined gap is formed between the outer pipe and the inner peripheral surface of the rotating shaft. Thus, the discharge port of the first inner pipe is opposed to the rotation center of the substrate held by the plurality of holding members. Therefore, the gas is reliably supplied to the rotation center of the substrate from the first inner pipe. Thus supplying the gas to the rotation center of the substrate from the first inner pipe allows the processing liquid existing on the one surface of the substrate to be reliably splashed outward from the substrate.

(5) The inner diameter of the first inner pipe may be larger than the inner diameter of each of the plurality of second inner pipes.

In this case, the sufficient amount of first fluid can be supplied to the substrate from the first inner pipe.

(6) According to another aspect of the present invention, a substrate processing method is for subjecting a substrate to predetermined processing using a substrate processing apparatus. The substrate processing apparatus includes a rotation-driving device having a hollow rotating shaft extending in the vertical direction, a rotating member attached to the rotating shaft so as to rotate together with the rotating shaft and having an opening at its center, a plurality of holding members that are provided in the rotating member and hold an outer edge of the substrate, and a fluid supplying mechanism that supplies a first fluid and a second fluid to one surface of the substrate held by the plurality of holding members. The fluid supplying mechanism includes an outer pipe made of metal that is inserted into the rotating shaft of the rotation-driving device and the opening of the rotating member and is supported on the rotation-driving device such that a predetermined gap is formed between the outer pipe and an inner peripheral surface of the rotating shaft, a first inner pipe made of resin which is inserted through the center of the inside of the outer pipe and has a discharge port at its end opposed to the one surface of the substrate for supplying the first fluid to the substrate from the discharge port, and a plurality of second inner pipes made of resin which is inserted into a portion, around the first inner pipe, of the outer pipe in contact with an outer peripheral surface of the first inner pipe and an inner peripheral surface of the outer pipe and respectively have discharge ports at their ends opposed to the one surface of the substrate for supplying the second fluid to the substrate from the discharge port, the first fluid is a gas, and the second fluid is a processing liquid. The substrate processing method includes the steps of rotating the substrate held by the plurality of holding members at a predetermined rotation speed by the rotation-driving device, supplying the processing liquid from the second inner pipe to the one surface of the substrate held by the plurality of holding members, rotating the substrate held by the plurality of holding members at a rotation speed lower than the predetermined rotation speed, and stopping the supply of the processing liquid to the one surface of the substrate held by the plurality of holding members, and supplying the gas from the first inner pipe to the one surface of the substrate.

In the substrate processing apparatus used for the substrate processing method, the plurality of holding members provided in the rotating member hold the outer edge of the substrate. The rotating member is attached to the rotating shaft of the rotation-driving device. This causes the rotating member, together with the rotating shaft, to be rotated by the rotation-driving device while causing the substrate held by the plurality of holding members to rotate.

The outer pipe made of metal in the fluid supplying mechanism is inserted through the rotating shaft of the rotation-driving device and the opening of the rotating member. The outer pipe is supported on the rotation-driving device such that a predetermined gap is formed between the outer pipe and the inner peripheral surface of the rotating shaft. The outer pipe made of metal has high rigidity. Even when the rotating shaft rotates, therefore, the gap between the outer pipe and the inner peripheral surface of the rotating shaft is kept constant.

The first inner pipe and the plurality of inner pipes are inserted into the outer pipe. The gas is supplied to the one surface of the substrate that rotates from the discharge port at the end of the first inner pipe, or the processing liquid is supplied thereto from the discharge ports at the ends of the plurality of second inner pipes. This causes the substrate to be processed.

Inside the outer pipe, the first inner pipe is inserted into the center thereof. Furthermore, the plurality of second inner pipes are inserted in contact with the outer peripheral surface of the first inner pipe and the inner peripheral surface of the outer pipe. This causes the first inner pipe to be positioned automatically and with high precision at the center of the inside of the outer pipe by the plurality of second inner pipes, while causing the plurality of second inner pipes to be positioned automatically and with high precision by the outer peripheral surface of the first inner pipe and the inner peripheral surface of the outer pipe. This allows the gas and the cleaning liquid to be supplied to the center of the one surface of the substrate with high precision.

The outer pipe is supported on the rotation-driving device. Even when the rotation-driving device vibrates, therefore, the positional relationship between the rotating shaft and the outer pipe is held. This reliably prevents the outer pipe from coming into contact with the rotating shaft.

Furthermore, the first inner pipe made of resin and the plurality of second inner pipes made of resin have flexibility, so that the first inner pipe and the second inner pipes can be easily inserted into the outer pipe. Since the first inner pipe and the plurality of second inner pipes are inserted into the outer pipe, the fluid supplying mechanism becomes compact. Therefore, it is possible to miniaturize the substrate processing apparatus.

In addition, the fluid supplying mechanism can be easily assembled on the substrate processing apparatus by attaching to the rotation-driving device the outer pipe in which the first inner pipe and the plurality of second inner pipes have been inserted. Therefore, it becomes possible to easily manufacture the substrate processing apparatus.

In the substrate processing method, the rotation-driving device rotates the substrate held by the plurality of holding members at the predetermined rotation speed. The processing liquid is supplied from the second inner pipes to the one surface of the substrate held by the plurality of holding members.

In this case, the processing liquid can be supplied to the one surface of the substrate that rotates from the discharge ports of the plurality of second inner pipes. Therefore, it becomes possible to quickly supply a large amount of processing liquid to the substrate. This allows a time period required to process the substrate to be shortened.

Thereafter, the substrate held by the plurality of holding members is rotated at a rotation speed lower than the predetermined rotation speed. This allows a liquid layer of the processing liquid to be formed on the one surface of the substrate, thereby allowing the processing liquid to be reliably supplied to the whole one surface of the substrate.

The supply of the processing liquid to the one surface of the substrate held by the plurality of holding members is stopped, so that the gas is supplied to the one surface of the substrate from the first inner pipe. This causes the processing liquid at the center of the substrate to move to the peripheral portion of the substrate. Thus supplying the gas to the one surface of the substrate that rotates causes the processing liquid that adheres to the one surface of the substrate to be quickly removed, allowing the substrate to be sufficiently and reliably dried.

Here, the first inner pipe is positioned at the center of the inside of the outer pipe, and the outer pipe is supported on the rotation-driving device such that a predetermined gap is formed between the outer pipe and the inner peripheral surface of the rotating shaft. Thus, the discharge port of the first inner pipe is opposed to the rotation center of the substrate held by the plurality of holding members. Therefore, the gas is reliably supplied to the rotation center of the substrate from the first inner pipe. Thus supplying the gas to the rotation center of the substrate from the first inner pipe allows the processing liquid existing on the one surface of the substrate to be reliably splashed outward from the substrate.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a plan view of a substrate processing apparatus according to an embodiment of the present invention;

DETAILED DESCRIPTION OF THE INVENTION

Figure 2:
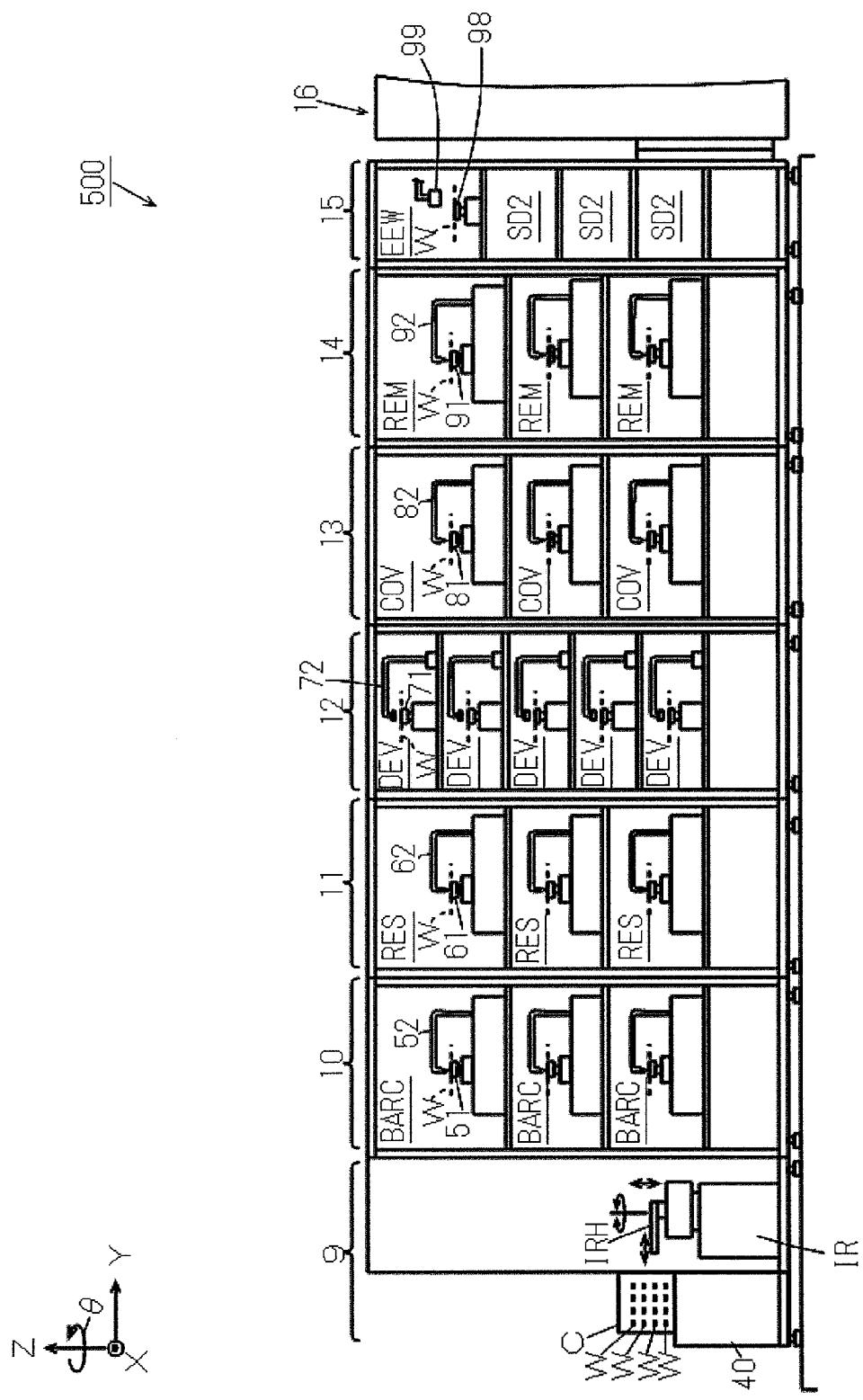
FIG. 2 is a side view on one side of the substrate processing apparatus shown in FIG. 1.

A substrate processing apparatus according to an embodiment of the present invention and a substrate processing method using the same will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing Apparatus

FIG. 1 is a plan view of a substrate processing apparatus according to an embodiment of the present invention. FIG. 1 and FIGS. 2 to 4 described later are accompanied by arrows that respectively indicate X, Y, and Z directions perpendicular to one another for clarity of a positional relationship. The X and Y directions are perpendicular to each other within a horizontal plane, and the Z direction corresponds to the vertical direction. In each of the directions, the direction of the arrow is defined as a + direction, and the opposite direction is defined as a − direction. A rotation direction centered around the Z direction is defined as a θ direction.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 that controls the operation of each of the processing blocks, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination whether or not the substrate W is placed on the substrate platform PASS1 or PASS2. Furthermore, each of the substrate platforms PASS1 and PASS2 has a plurality of support pins secured thereto. Note that each of substrate platforms PASS3 to PASS13 described later is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described later. The removal processing group 90 is opposed to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a sending buffer unit SBF, cleaning/drying processing units SD1, a sixth central robot CR6, an edge exposure unit EEW, a return buffer unit RBF, placement/cooling units PASS-CP (hereinafter abbreviated as P-CP), a substrate platform PASS13, an interface transport mechanism IFR, and cleaning/drying processing units SD2. The cleaning/drying processing unit SD1 subjects the substrate W before exposure processing to cleaning and drying processing, and the cleaning/drying processing unit SD2 subjects the substrate W after exposure processing to cleaning and drying processing. The details of the cleaning/drying processing units SD1 and SD2 will be described later.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 3:
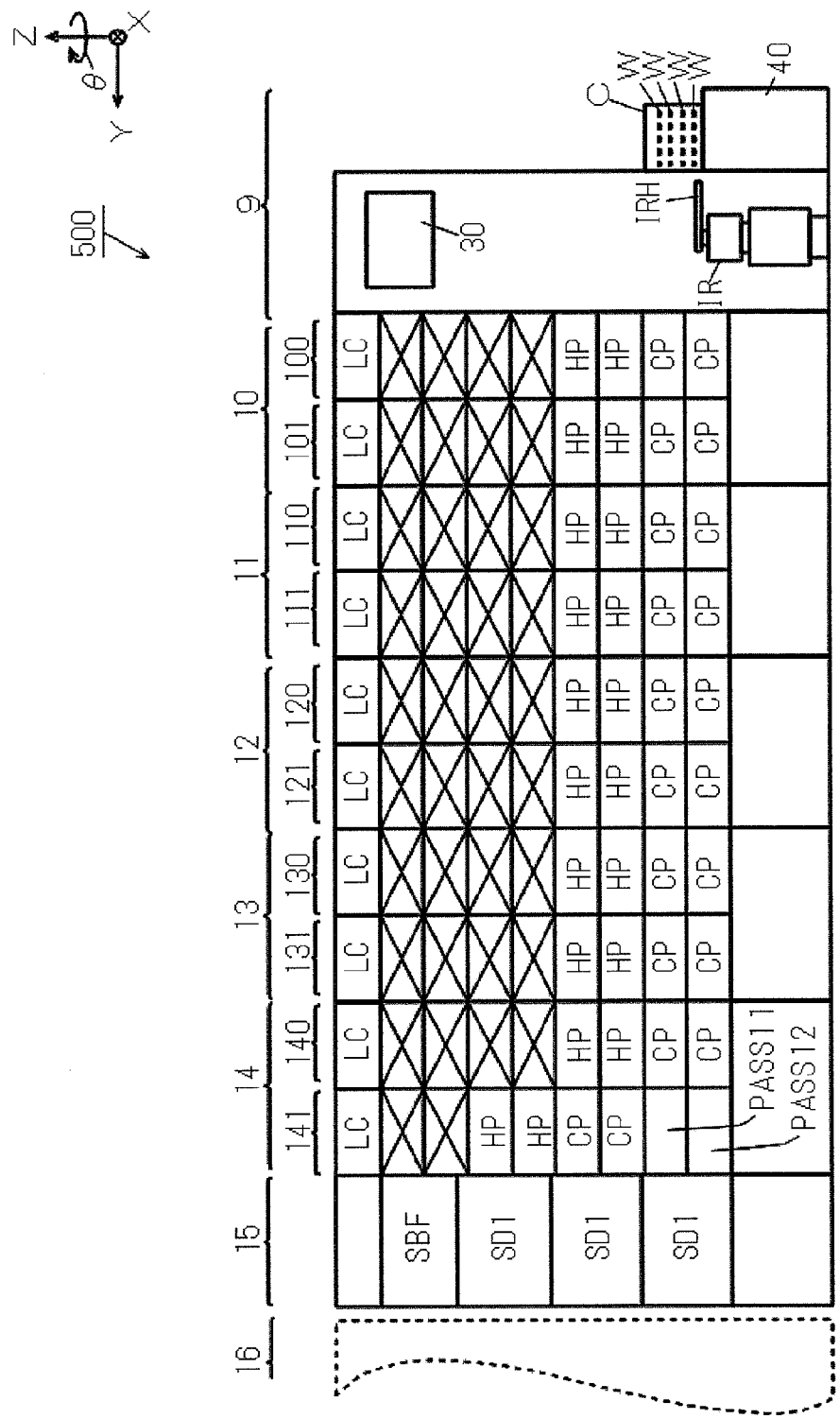
FIG. 3 is a side view on the other side of the substrate processing apparatus shown in FIG. 1.

FIG. 2 is a side view on one side of the substrate processing apparatus 500 shown in FIG. 1, and FIG. 3 is a side view on the other side of the substrate processing apparatus 500 shown in FIG. 1. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2. As shown in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 (see FIG. 1) has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 (see FIG. 1) has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g. fluororesin) to the substrate W held on the spin chuck 91. Each of the removal units REM removes the resist cover film formed on the substrate W by applying the stripping liquid onto the substrate W while rotating the substrate W.

Note that a method of removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of an edge exposure unit EEW and three cleaning/drying processing units SD2 on the +X side. The edge exposure unit EEW includes a spin chuck 98 for rotating the substrate W with the substrate held in a horizontal attitude by suction and a light irradiator 99 for exposing a peripheral portion of the substrate W held on the spin chuck 98.

Description is now made of the configuration on the −X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

The interface block 15 will be described in detail using FIG. 4.

Figure 4:
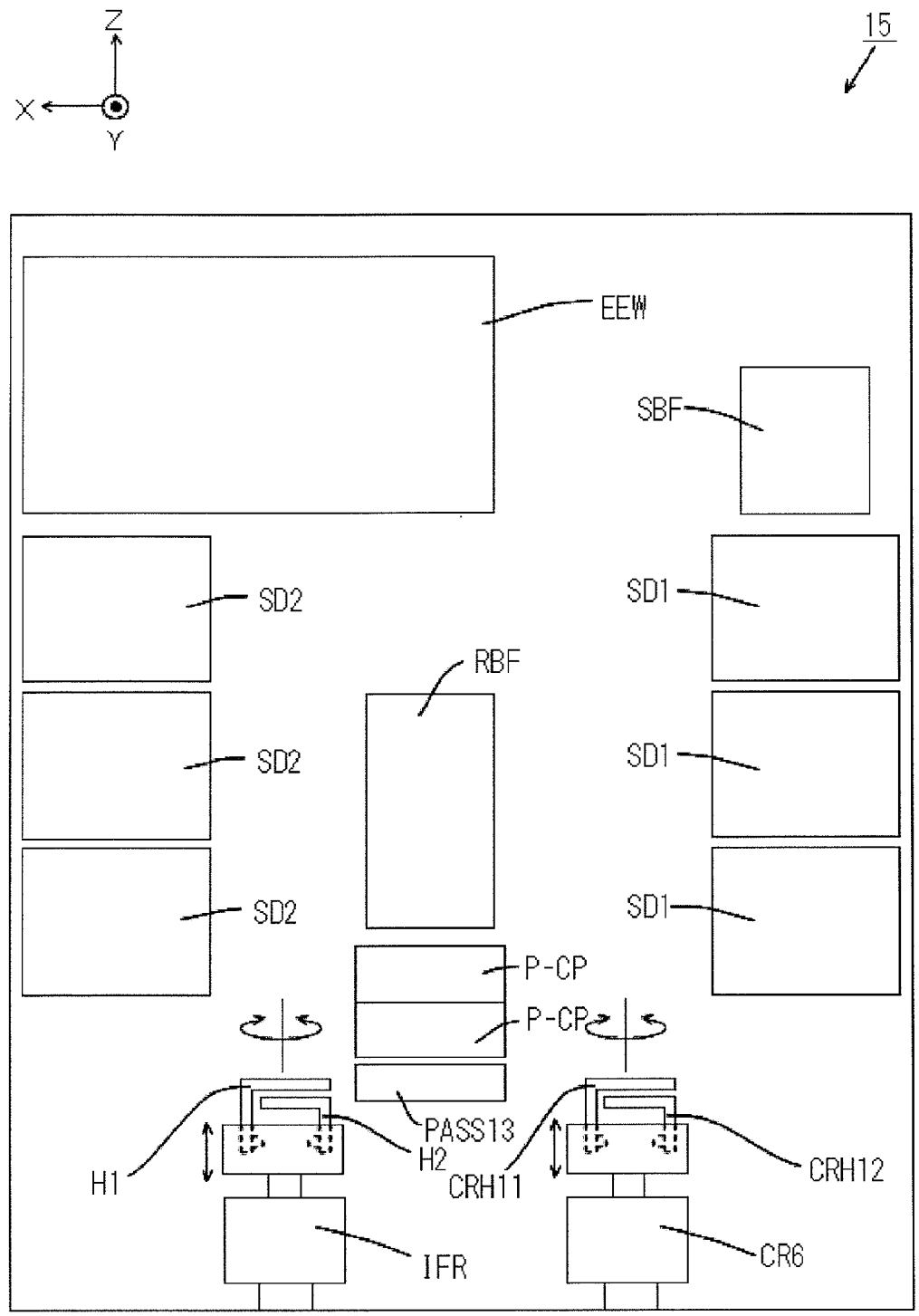
FIG. 4 is a schematic side view of an interface block as viewed from an exposure device.

FIG. 4 is a schematic side view of the interface block 15 as viewed from the exposure device 16. As shown in FIG. 4, the interface block 15 has a stack of the sending buffer unit SBF and the three cleaning/drying processing units SD1 on the −X side. The interface block 15 has an edge exposure unit EEW arranged on the +X side in its upper part.

The interface block 15 has a vertical stack of a return buffer unit RBF, two placement/cooling units P-CP, and a substrate platform PASS13 at its substantially central portion below the edge exposure unit EEW. The interface block 15 has a vertical stack of three cleaning/drying processing units SD2 arranged on the +X side below the edge exposure unit EEW.

A sixth central robot CR6 and an interface transport mechanism IFR are provided in a lower part of the interface block 15. The sixth central robot CR6 is vertically movable and rotatable in an area among the sending buffer unit SBF, the cleaning/drying processing units SD1, the edge exposure unit EEW, the return buffer unit RBF, the placement/cooling units P-CP, and the substrate platform PASS13. The interface transport mechanism IFR is vertically movable and rotatable in an area among the return buffer unit RBF, the placement/cooling units P-CP, the substrate platform PASS13, and the cleaning/drying processing units SD2.

(2) Operation of Substrate Processing Apparatus

The operation of the substrate processing apparatus 500 according to the present embodiment will be then described with reference to FIGS. 1 to 4.

(2-1) Operations of Indexer Block to Resist Cover Film Removal Block

First, the operations of the indexer block 9 to the resist cover film removal block 14 will be briefly described.

Carriers C that store a plurality of substrates W in a multiple stage are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film. The formation of the resist cover film prevents the resist film from coming into contact with the liquid even if the substrate W comes into contact with the liquid in the exposure device 16 while preventing a component of a resist from being eluded in the liquid.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the resist cover film is removed.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be described.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the cleaning/drying processing units SD1. In the cleaning/drying processing unit SD1, the substrate W before the exposure processing is subjected to cleaning and drying processing, as described above.

Here, a time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF (FIG. 4). In the present embodiment, the sixth central robot CR6 takes out the substrate W after the cleaning and drying processing from the cleaning/drying processing unit SD1 and transports the substrate W to the sending buffer unit SBF.

The sixth central robot CR6 then takes out the substrate W stored in the sending buffer unit SBF and carries the substrate W into the placement/cooling unit P-CP. The substrate W carried into the placement/cooling unit P-CP is kept at the same temperature as that in the exposure device 16 (for example, 23° C.).

In a case where the exposure device 16 has a sufficient processing speed, the substrate W need not be stored in the sending buffer unit SBF but may be transported to the placement/cooling unit P-CP from the cleaning/drying processing unit SD1.

The substrate W kept at the above-mentioned predetermined temperature in the placement/cooling unit P-CP is then received with the upper hand H1 of the interface transport mechanism IFR (FIG. 4) and carried into a substrate inlet 16*a* in the exposure device 16 (FIG. 1).

The substrate W that has been subjected to the exposure processing in the exposure device 16 is carried out of a substrate outlet 16*b* (FIG. 1) with the lower hand H2 of the interface transport mechanism IFR (FIG. 4). The interface transport mechanism IFR carries the substrate W into any one of the cleaning/drying processing units SD2 with the hand H2. In the cleaning/drying processing unit SD2, the substrate W after the exposure processing is subjected to cleaning and drying processing, as described above.

The substrate W that has been subjected to the cleaning and drying processing in the cleaning/drying processing unit SD2 is taken out with the hand HI of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

Note that when the resist cover film removal block 14 cannot temporarily receive the substrate W due to a failure or the like in the removal unit REM (FIG. 2), the substrate W after the exposure processing can be temporarily stored in the return buffer unit RBF.

Here, although in the present embodiment, the sixth central robot CR6 transports the substrate W among the substrate platform PASS11 (FIG. 1), the edge exposure unit EEW, the cleaning/drying processing units SD1, the sending buffer unit SBF, the placement/cooling units P-CP, the substrate platform PASS13, and the thermal processing group 141, a series of such operations can be performed in a short time (e.g., 24 seconds).

Although the interface transport mechanism IFR transports the substrate W among the placement/cooling units P-CP, the exposure device 16, the cleaning/drying processing units SD2, and the substrate platform PASS13, a series of such operations can be performed in a short time (e.g., 24 seconds).

As a result of these, throughput can be reliably improved.

(3) Cleaning/Drying Processing Unit

Figure 5:
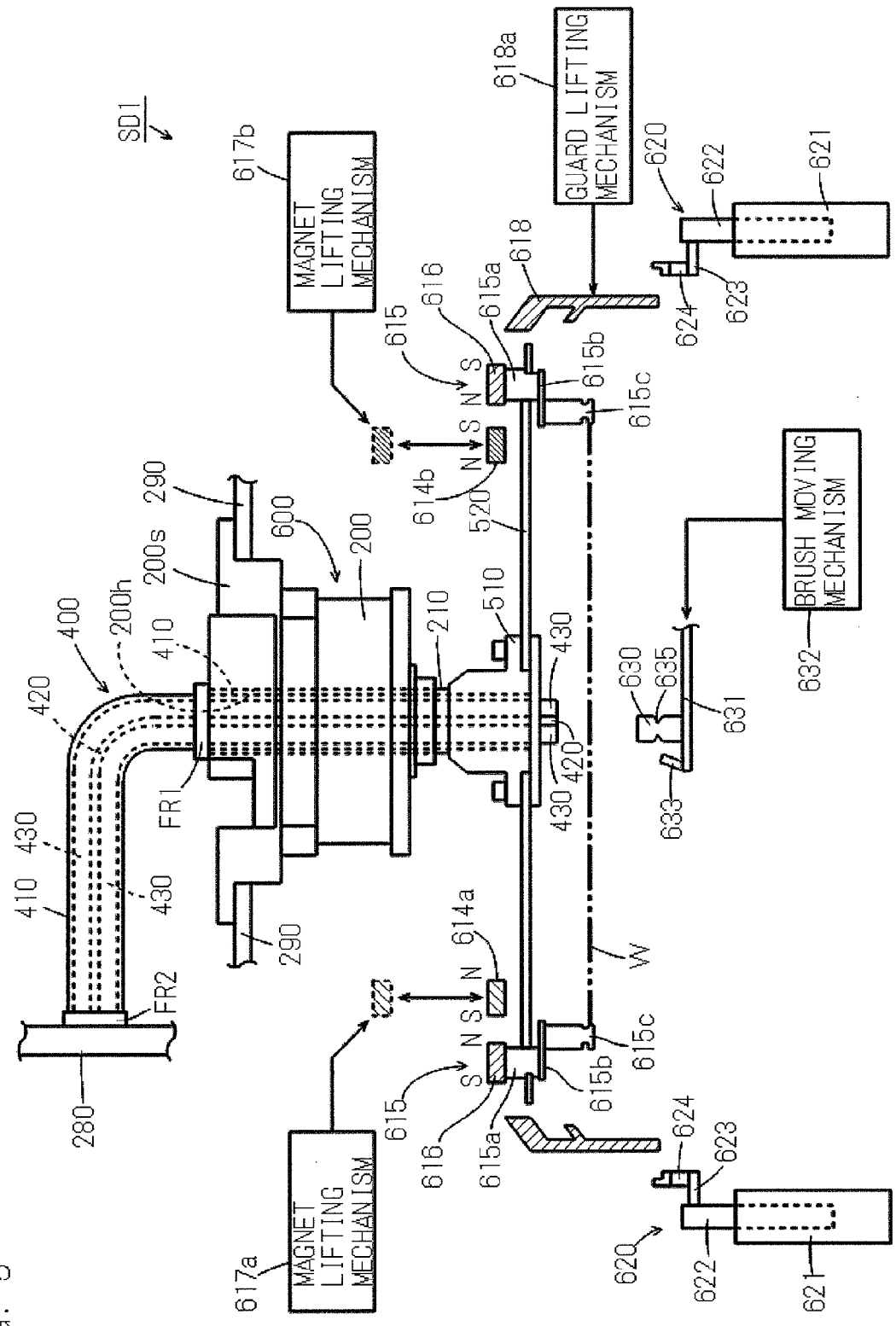
FIG. 5 is a side view showing the configuration of a cleaning/drying processing unit.
Figure 6:
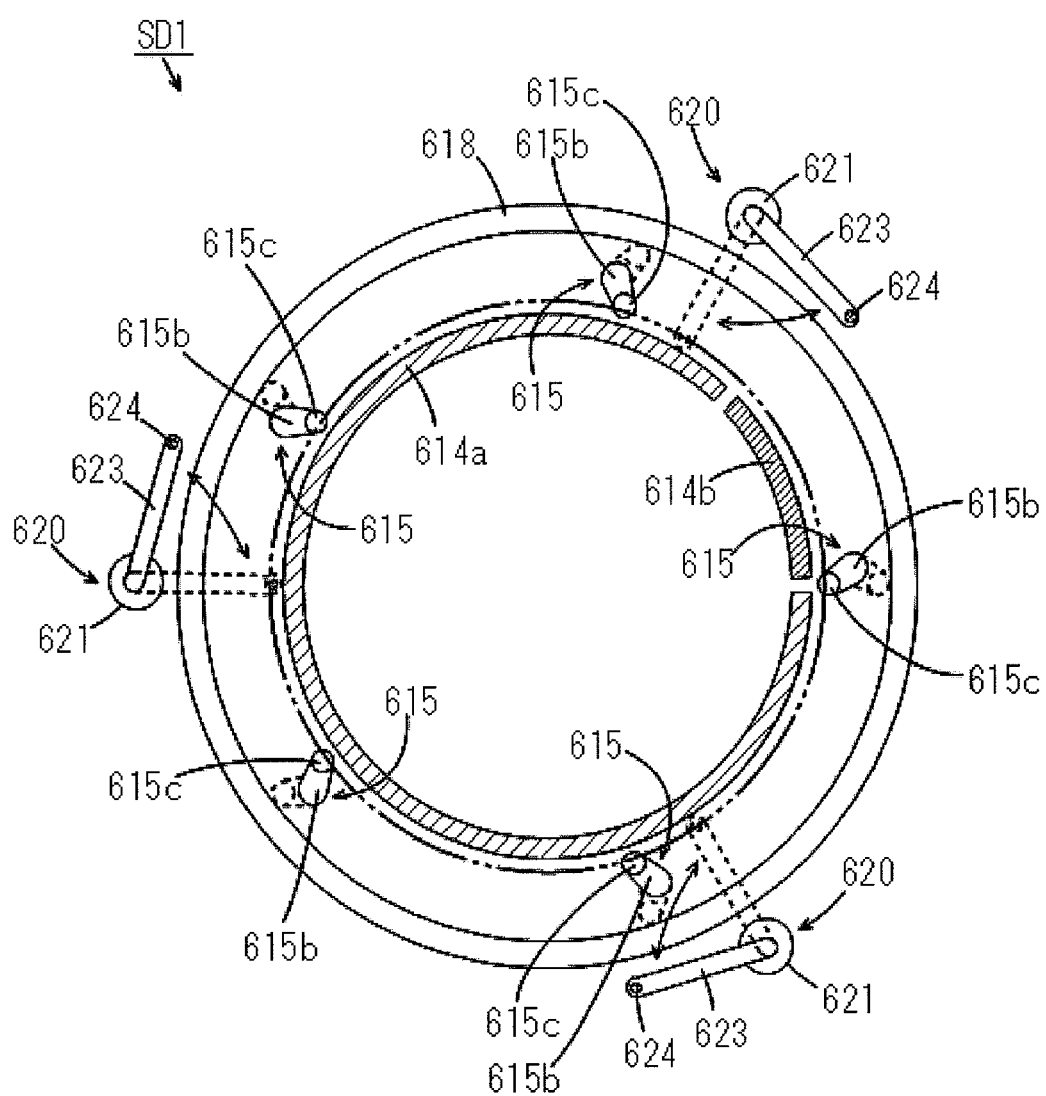
FIG. 6 is a schematic plan view showing the configuration of a cleaning/drying processing unit.

The cleaning/drying processing unit SD1 will be described with reference to the drawings. FIGS. 5 and 6 are respectively a side view and a schematic plan view showing the configuration of the cleaning/drying processing unit SD1. FIG. 6 schematically shows some of the constituent elements in the cleaning/drying processing unit SD1. The cleaning/drying processing unit SD2 has the same configuration as the cleaning/drying processing unit SD1.

Note that in the present embodiment, each of the cleaning/drying processing units SD1 and SD2 includes a case (not shown), and the following constituent elements are provided within the case.

As shown in FIGS. 5 and 6, the cleaning/drying processing unit SD1 includes a spin chuck 600 that rotates the substrate W with the substrate W held horizontally. The spin chuck 600 includes a spin motor 200, a rotating shaft 210, a disk-shaped spin plate 520, a plate supporting member 510, magnet plates 614*a* and 614*b*, and a plurality of chuck pins 615.

The spin motor 200 is provided in an upper part of the cleaning/drying processing unit SD1. The spin motor 200 is supported by a motor supporting member 200*s*. The motor supporting member 200*s* has a through hole 200*h* extending in the vertical direction, and is attached to a motor fixer 290. The motor fixer 290 is attached to the case (not shown) of the cleaning/drying processing unit SD1.

The rotating shaft 210 having a cylindrical shape extends downward from the inside of the spin motor 200. The rotating shaft 210 functions as an output shaft of the spin motor 200, and has an inner diameter of approximately 20 mm.

The plate supporting member 510 is attached to a lower end of the rotating shaft 210. The plate supporting member 510 has a cylindrical shape, as described later. The plate supporting member 510 supports the spin plate 520 horizontally. The spin motor 200 causes the rotating shaft 210 to rotate, causing the spin plate 210, together with the plate supporting member 510, to rotate around a vertical axis.

A fluid supply pipe 400 is inserted through the through hole 200*h* of the motor supporting member 200*s*, the rotating shaft 210 extending from the spin motor 200, and the plate supporting member 510. A cleaning liquid and a gas can be supplied onto the substrate W held by the spin chuck 600 through the fluid supply pipe 400. The details of the configuration of the fluid supply pipe 400 and its peripheral members will be described later.

A plurality of (five in this example) chuck pins 520 are equiangularly spaced with respect to the rotating shaft 210 in a peripheral portion of the spin plate 520. It is desirable that the number of chuck pins 615 is not less than five. This reason for this will be described later.

Each of the chuck pins 615 includes a shaft 615*a*, a pin supporter 615*b*, a holder 615*c*, and a magnet 616. The shaft 615*a* penetrates the spin plate 520, and the pin supporter 615*b* extending in the horizontal direction is connected to a lower end of the shaft 615*a*. The holder 615*c* projects downward from a tip of the pin supporter 615*b*. Furthermore, the magnet 616 is attached to an upper end of the shaft 615*a* on an upper surface of the spin plate 612.

Each of the chuck pins 615 is rotatable around the vertical axis with the shaft 615*a* used as its center, and is swichable between a closed state where the holder 615*c* is abutted against an outer edge of the substrate W and an opened state where the holder 615*c* is spaced apart from the outer edge of the substrate W. Note that each of the chuck pins 615 enters the closed state when the N pole of the magnet 616 is on the inner side, while entering the opened state when the S pole of the magnet 616 is on the inner side in this example.

The magnet plates 614*a* and 614*b* are arranged along the circumference direction with the rotating shaft 210 used as its center above the spin plate 520. Each of the magnet plates 614*a* and 614*b* has the S pole and the N pole, respectively, on the outer side and the inner side. The magnet plates 614*a* and 614*b* are independently lifted, respectively, by magnet lifting mechanisms 617*a* and 617*b*, and move between an upper position higher than the magnet 616 in the chuck pin 615 and a lower position substantially equal in height to the magnet 616 in the chuck pin 615.

Each of the chuck pins 615 is switched between the opened state and the closed state by lifting the magnet plates 614*a* and 614*b*. The details of the operations of the magnet plates 614*a* and 614*b* and the chuck pin 615 will be described later.

A guard 618 for receiving a cleaning liquid scattered from the substrate W is provided outside the spin chuck 600. The guard 618 is shaped to be rotationally-symmetric with respect to the rotating shaft 210 in the spin chuck 600. Furthermore, the guard 618 is lifted by a guard lifting mechanism 618*a*. The cleaning liquid received by the guard 618 is discharged or recovered by a liquid discharge device or a recovery device (not shown).

Three or more (three in this example) substrate interface mechanisms 620 are equiangularly arranged with the rotating shaft 210 in the spin chuck 600 used as its center outside the guard 618. Each of the substrate interface mechanisms 620 includes a lifting and rotation driver 621, a rotating shaft 622, an arm 623, and a holding pin 624. The rotating shaft 622 extends upward from the lifting and rotation driver 621, and the arm 623 extends in the horizontal direction from an upper end of the rotating shaft 622. The holding pin 624 for holding the outer edge of the substrate W is provided at a tip of the arm 623.

The lifting and rotation driver 621 causes the rotating shaft 622 to perform a lifting operation and a rotation operation. Thus, the holding pin 624 moves in the horizontal direction and the vertical direction.

Furthermore, a cleaning brush 630 for cleaning the outer edge and a back surface of the substrate W held by the spin chuck 600 is provided in a lower part of the cleaning/drying processing unit SD1. The cleaning brush 630 has a substantially columnar shape, and has a groove 635 with a V-shaped cross section formed on its outer peripheral surface. The cleaning brush 630 is held by a brush holding member 631. The brush holding member 631 is driven by a brush moving mechanism 632, so that the cleaning brush 630 moves in the horizontal direction and the vertical direction.

A cleaning nozzle 633 is attached to a portion, in close proximity to the cleaning brush 630, of the brush holding member 631. A liquid supply pipe (not shown) to which the cleaning liquid is supplied is connected to the cleaning nozzle 633. A discharge port of the cleaning nozzle 633 is directed toward the periphery of the cleaning brush 630, and the cleaning liquid is discharged toward the periphery of the cleaning brush 630 from the discharge port. In this example, an example of a cleaning liquid is pure water.

(4) Details of Fluid Supply Pipe

Figure 7:
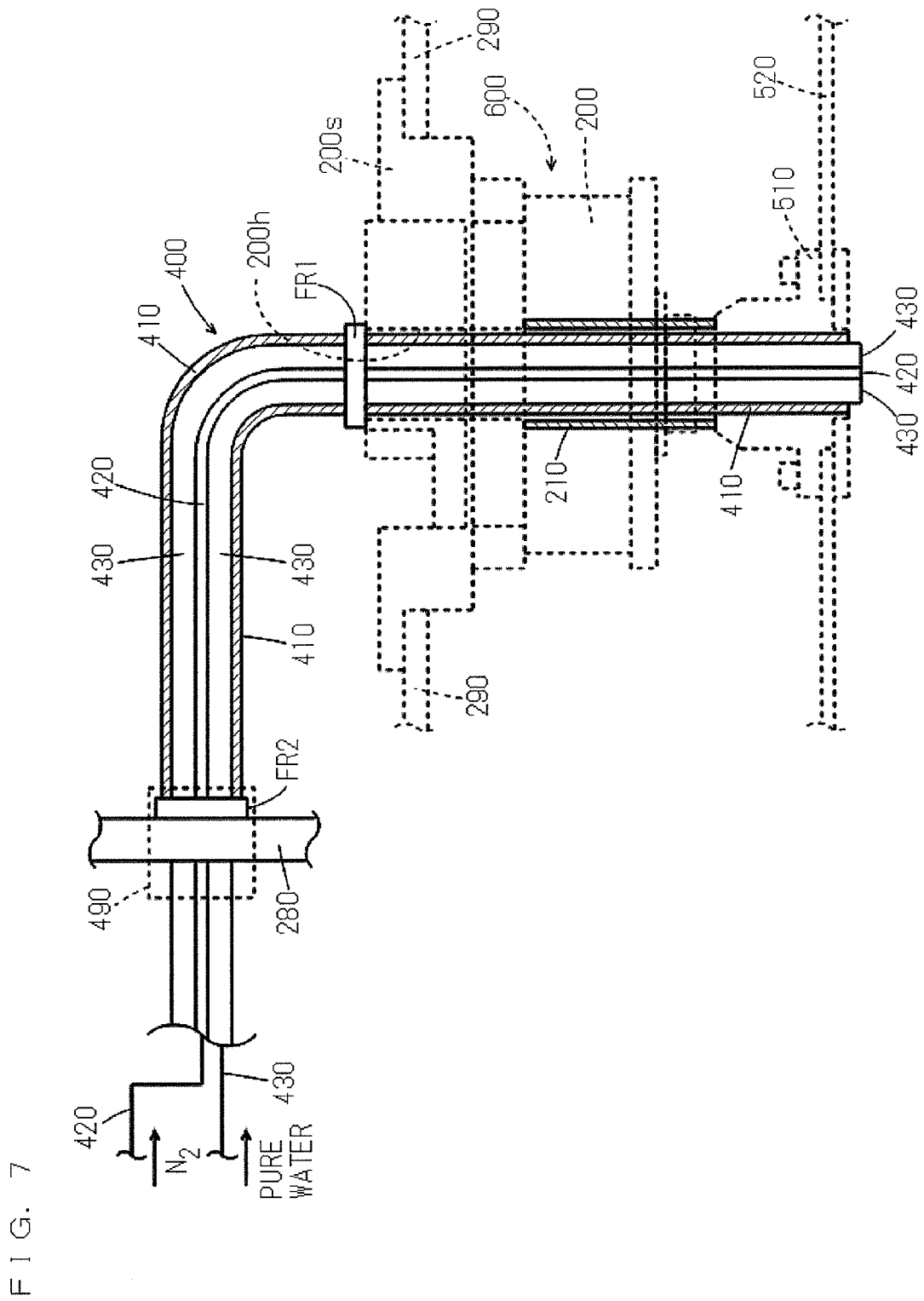
FIG. 7 is a vertical sectional view mainly showing the configuration of a fluid supply pipe shown in FIG. 5.
Figure 8:
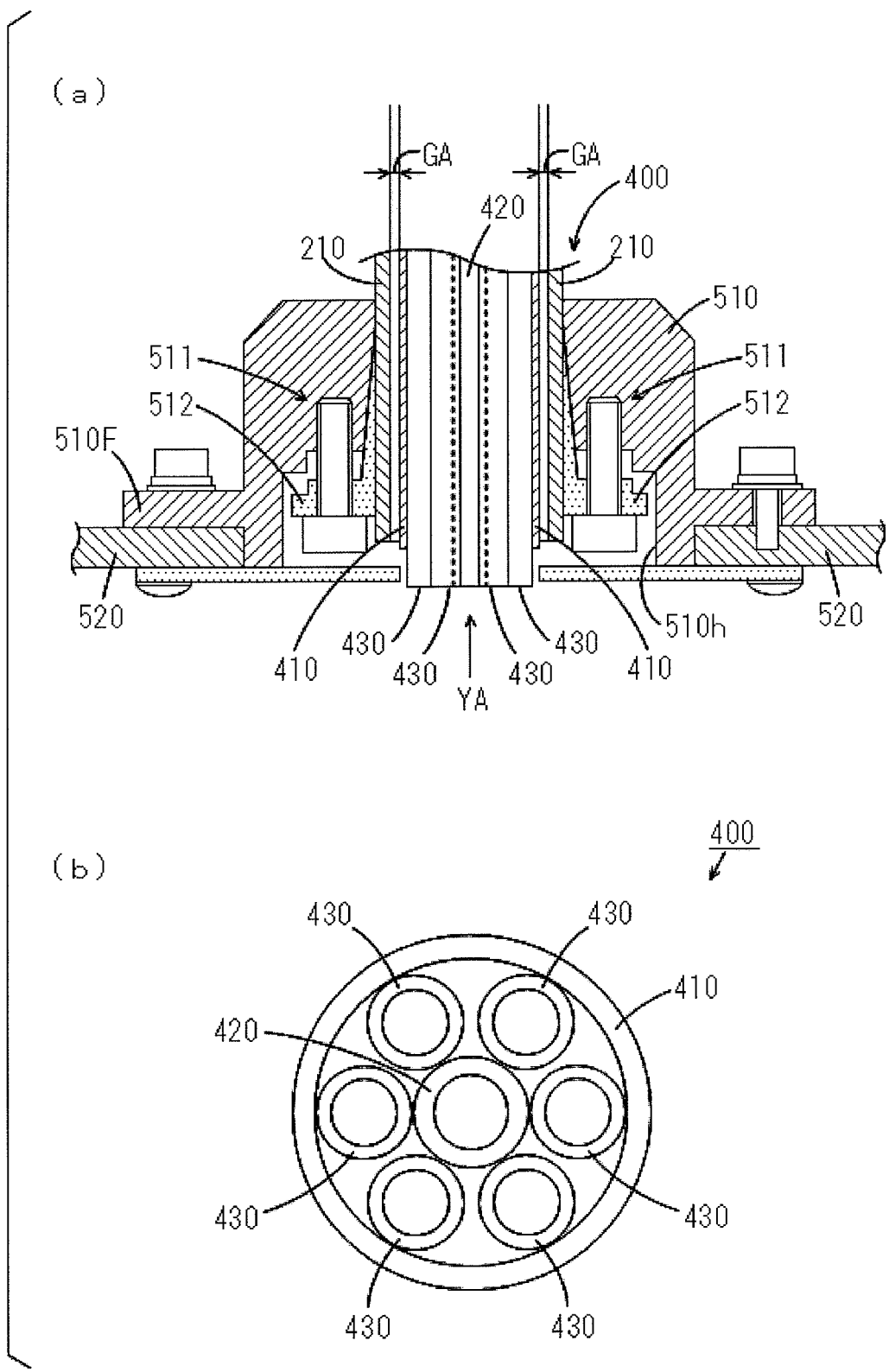
FIG. 8(a) is an enlarged vertical sectional view showing the configuration in the vicinity of downstream end of the fluid supply pipe shown in FIG. 5.
FIG. 8(b) is a plan view of a downstream end of the fluid supply pipe as viewed from an arrow YA shown in FIG. 8(a)

The details of the configuration of the fluid supply pipe 400 shown in FIG. 5 and its peripheral members will be described while referring to FIGS. 7 and 8. FIG. 7 is a vertical sectional view mainly showing the configuration of the fluid supply pipe 400 shown in FIG. 5. FIG. 8(a) is an enlarged vertical sectional view showing the configuration in the vicinity of a downstream end of the fluid supply pipe 400 shown in FIG. 5, and FIG. 8(b) is a plan view of a downstream end of the fluid supply pipe 400 as viewed from an arrow YA shown in FIG. 8(a).

As described above, the fluid supply pipe 400 is inserted through the motor supporting member 200s, the spin motor 200, the rotating shaft 210, and the plate supporting member 510.

As shown in FIG. 7, the fluid supply pipe 400 is curved above the motor supporting member 200s, to extend in the horizontal direction. In the following description, an end of a straight portion, extending in the vertical direction, of the pipe is referred to as a downstream end, and an end of a straight portion, extending in the horizontal direction, of the pipe is referred to as an upstream end.

In the fluid supply pipe 400, a first flange FR1 is integrally formed in the vicinity of a curved portion of the straight portion extending in the vertical direction. A second flange FR2 is integrally formed at the upstream end thereof.

The first flange FR1 is fixed to the motor supporting member 200s, and the second flange FR2 is fixed to a pipe fixer 280. The pipe fixer 280 is attached to a case (not shown) of the cleaning/drying processing unit SD1.

Thus, the fluid supply pipe 400 is fixed to the case of the cleaning/drying processing unit SD1 by the pipe fixer 280, the motor supporting member 200s, and the motor fixer 290.

As described above, the spin motor 200 is supported by the motor supporting member 200s. Even when the fluid supply pipe 400 is attached to the motor supporting member 200s so that the spin motor 200 operates, therefore, the positional relationship between the fluid supply pipe 400 and the spin motor 200 is maintained. This prevents the position of the fluid supply pipe 400 from being shifted.

As shown in FIGS. 8(a) and 8(b), the fluid supply pipe 400 has a configuration in which one gas supply pipe 420 and a plurality of (six in this example) cleaning liquid supply pipes 430 are accommodated in a guide pipe 410. The gas supply pipe 420 is used for supplying a gas ($N_2$ gas in this example) to the substrate W. The cleaning liquid supply pipe 430 is used for supplying a cleaning liquid (pure water in this example) to the substrate W.

In the present embodiment, the guide pipe 410 is composed of stainless steel, and has an outer diameter of approximately 18 mm. The gas supply pipe 420 and the cleaning liquid supply pipe 430 are composed of fluororesin such as PTFE (polytetrafluoroethylene) and PFA (tetrafluoroethylene-perfluoroalkoxyethylene copolymer), and respectively have outer diameters of approximately 6 mm and approximately 5 mm.

Inside the guide pipe 410, the one gas supply pipe 420 has its axis along an axis of the guide pipe 410 with the one gas supply pipe 420 surrounded by the six cleaning liquid supply pipes 430. Here, the inner diameter of the guide pipe 410 is approximately equal to the sum of the outer diameter of the gas supply pipe 420 and twice the outer diameter of the cleaning liquid supply pipe 430. In this case, each of the plurality of cleaning liquid supply pipes 430 is abutted against an outer peripheral surface of the gas supply pipe 420 and an inner peripheral surface of the guide pipe 410.

In this case, when the fluid supply pipe 400 is manufactured, inserting the one gas supply pipe 420 and the six cleaning liquid supply pipes 430 into the guide pipe 410 causes the gas supply pipe 420 to be easily and accurately positioned at the center of the inside of the guide pipe 410.

As shown in FIG. 8(a), respective downstream ends of the cleaning liquid supply pipes 430 and the gas supply pipe 420 project from a downstream end of the guide pipe 410. This prevents the cleaning liquid discharged from the cleaning liquid supply pipes 430 from adhering to the guide pipe 410 when the cleaning liquid is supplied to the substrate W from the cleaning liquid supply pipes 430, for example. This prevents the cleaning liquid that has adhered to the guide pipe 410 made of metal from causing metal contamination in the substrate W by dropping down on the top surface of the substrate W.

The peripheral members at the downstream end of the fluid supply pipe 400 will be described. In this example, the rotating shaft 210 has an inner diameter of approximately 20 mm, and the guide pipe 410 has an outer diameter of approximately 18 mm, as described above. Thus, a gap GA of approximately 1 mm is formed between the rotating shaft 210 and the guide pipe 410 with the fluid supply pipe 400 attached to the motor supporting member 200s and the pipe fixer 280 as shown in FIG. 7.

The plate supporting member 510 having a substantially cylindrical shape is attached to the rotating shaft 210 in the vicinity of the downstream end of the fluid supply pipe 400. The plate supporting member 510 has an inner peripheral surface 510h formed in a stepped shape along its axis.

When the plate supporting member 510 is attached to the rotating shaft 210, a pad fixing piece 512 having a cylindrical shape is fitted in a gap between the inner peripheral surface 510h of the plate supporting member 510 and an outer peripheral surface of the rotating shaft 210, and the pad fixing piece 512 is screwed into a screw receiver 511 in the plate supporting member 510. This causes the plate supporting member 510 to be reliably fixed to the tip of the rotating shaft 210.

A flange 510F is formed in the vicinity of a lower end of the plate supporting member 510. The flange 510F and the spin plate 520 are screwed into each other, so that the spin plate 520 is fixed to the rotating shaft 210.

Returning to FIG. 7, the second flange FR2 is formed, as described above, at the upstream end of the fluid supply pipe 400. The second flange FR2 is fixed to the pipe fixer 280.

Here, in the vicinity of the upstream end of the fluid supply pipe 400, there is provided a supply pipe fixer 490 that fixes the one gas supply pipe 420 and the six cleaning liquid supply pipes 430 to each other and fixes them to the guide pipe 410.

In the supply pipe fixer 490, the gas supply pipe 420 and the cleaning liquid supply pipes 430 are fixed to each other by fusion processing or with adhesives, for example. Furthermore, the gas supply pipe 420 and the cleaning liquid supply pipes 430 are fixed to the guide pipe 410 using a pressure sensitive adhesive sheet or the like.

The supply pipe fixer 490 fixes the positional relationship among the guide pipe 410, the gas supply pipe 420, and the cleaning liquid supply pipes 430. This causes the positional precision of each of the supply pipes 430 and 420 in the vicinity of the downstream end of the fluid supply pipe 400 to be improved.

The one gas supply pipe 420 and the six cleaning liquid supply pipes 430 that are inserted into the guide pipe 410 respectively extend outward from an upstream end of the guide pipe 410. An upstream end of the gas supply pipe 420 extending from the upstream end of the guide pipe 410 is connected to a gas supply device (not shown). Furthermore, respective upstream ends of the cleaning liquid supply pipes 430 extending from the upstream end of the guide pipe 410 are connected to a cleaning liquid supply device (not shown).

$N_2$ gas is supplied to the substrate W by being supplied to the gas supply pipe 420 from the gas supply device. Furthermore, pure water is supplied to the substrate W by being supplied to the cleaning liquid supply pipes 430 from the cleaning liquid supply device.

(5) Operation for Holding Substrate

Figure 9:
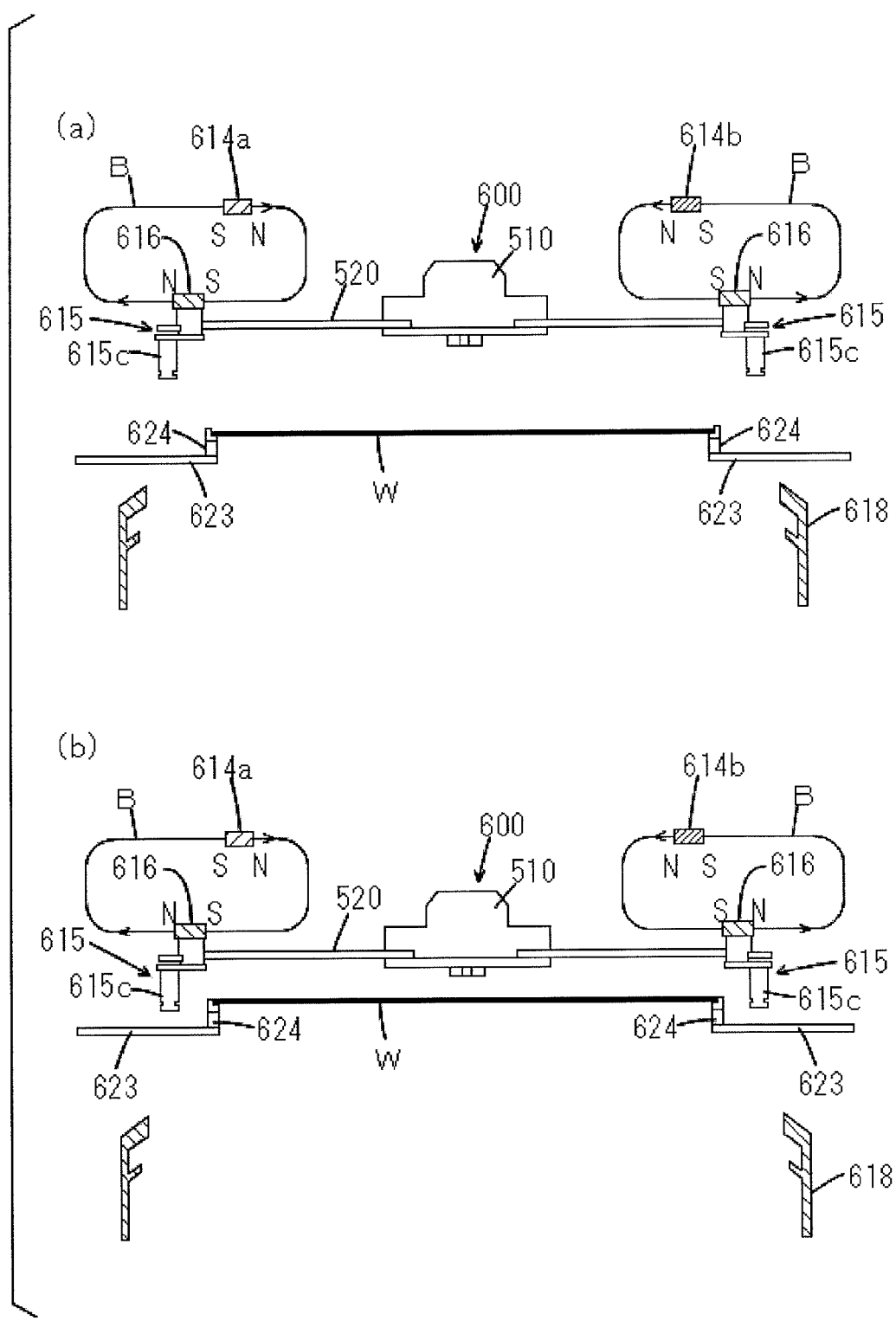
FIG. 9 is a diagram for explaining an operation for holding a substrate by a spin chuck.
Figure 10:
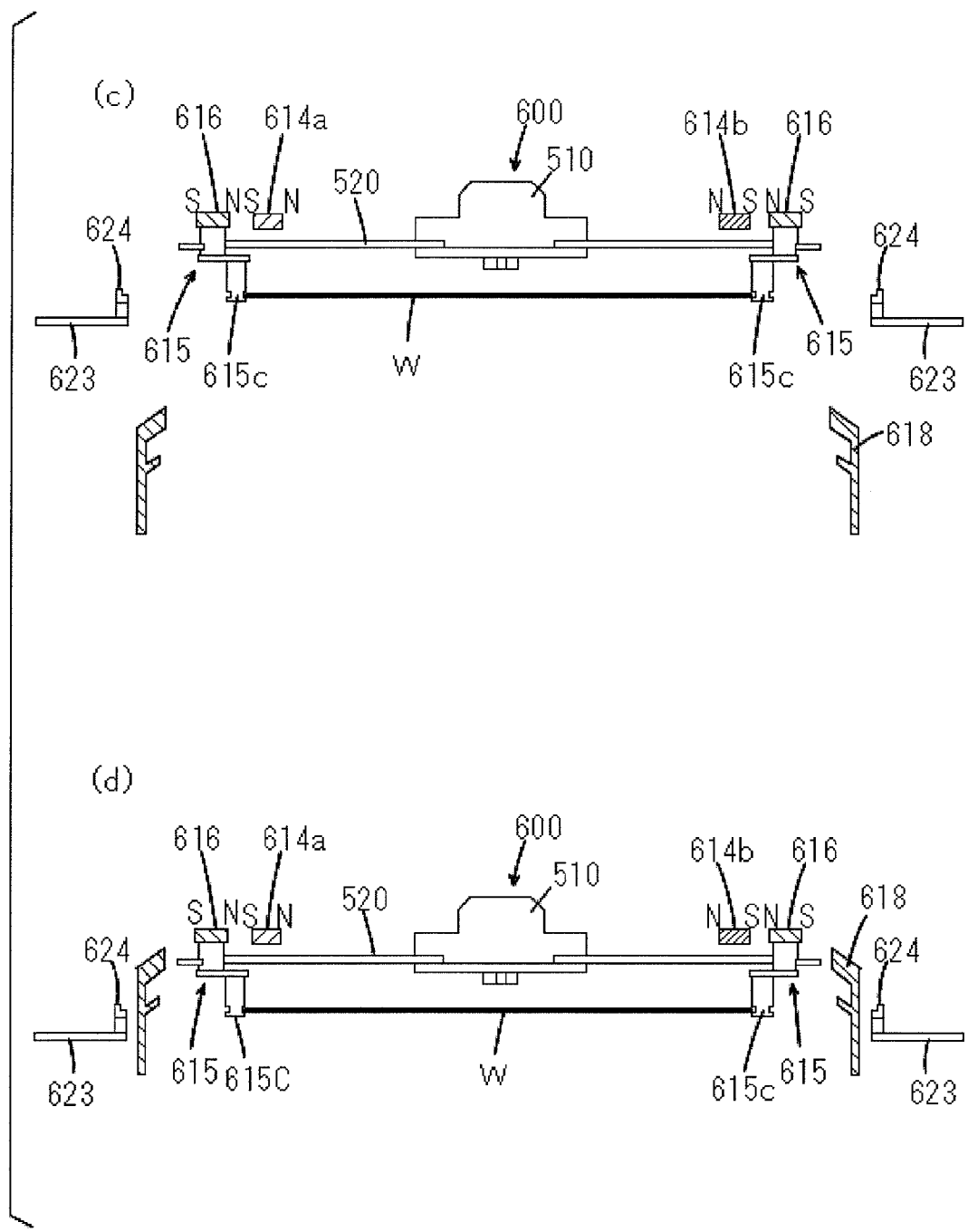
FIG. 10 is a diagram for explaining an operation for holding a substrate by a spin chuck.

An operation for holding the substrate W by the spin chuck 600 will be described. FIGS. 9 and 10 are diagrams for explaining the operation for holding the substrate W by the spin chuck 600.

First, the guard 618 moves to a position lower than the chuck pin 615, as shown in FIG. 9(*a*). The holding pin 624 in each of the plurality of substrate interface mechanisms 620 (FIG. 5) moves to a position below the spin plate 612 through a position above the guard 520. The substrate W is placed on the plurality of holding pins 624 by the sixth central robot CR6 (FIG. 1).

At this time, the magnet plates 614*a* and 614*b* are at an upper position. In this case, a line of magnetic force B of the magnet plates 614*a* and 614*b* is directed outward from inside at the height of the magnet 616 in the chuck pin 615. Therefore, the S pole of the magnet 616 in each of the chuck pins 615 is sucked inward. This causes each of the chuck pins 615 to enter the opened state.

Then, the plurality of holding pins 624 rise with the substrate W held therein, as shown in FIG. 9(*b*). This causes the substrate W to move to positions among the holders 615*c* in the plurality of chuck pins 615.

Then, the magnet plates 614*a* and 614*b* move to a lower position, as shown in FIG. 10(*c*). In this case, the N pole of the magnet 616 in each of the chuck pins 615 is sucked inward. This causes each of the chuck pins 615 to enter the closed state, causing the holder 615*c* in each of the chuck pins 615 to hold the outer edge of the substrate W. Note that each of the chuck pins 615 holds the outer edge of the substrate W between the adjacent holding pins 624. Therefore, the chuck pin 615 and the holding pin 624 do not interfere with each other. Thereafter, the plurality of holding pins 624 move outwardly from the guard 618.

Then, the guard 618 moves to a height at which the substrate W held by the chuck pin 615 is surrounded, as shown in FIG. 10(*d*). The substrate W is subjected to cleaning processing and drying processing in this order.

(6) Cleaning Processing and Drying Processing

In the cleaning/drying unit SD1, top surface cleaning processing for cleaning a top surface (an upper surface) of the substrate W, back surface cleaning processing for cleaning a back surface (a lower surface) of the substrate W, and bevel cleaning processing for cleaning the outer edge (a bevel portion) of the substrate W are performed as the cleaning processing. Thereafter, the substrate W is subjected to the drying processing.

Figure 11:
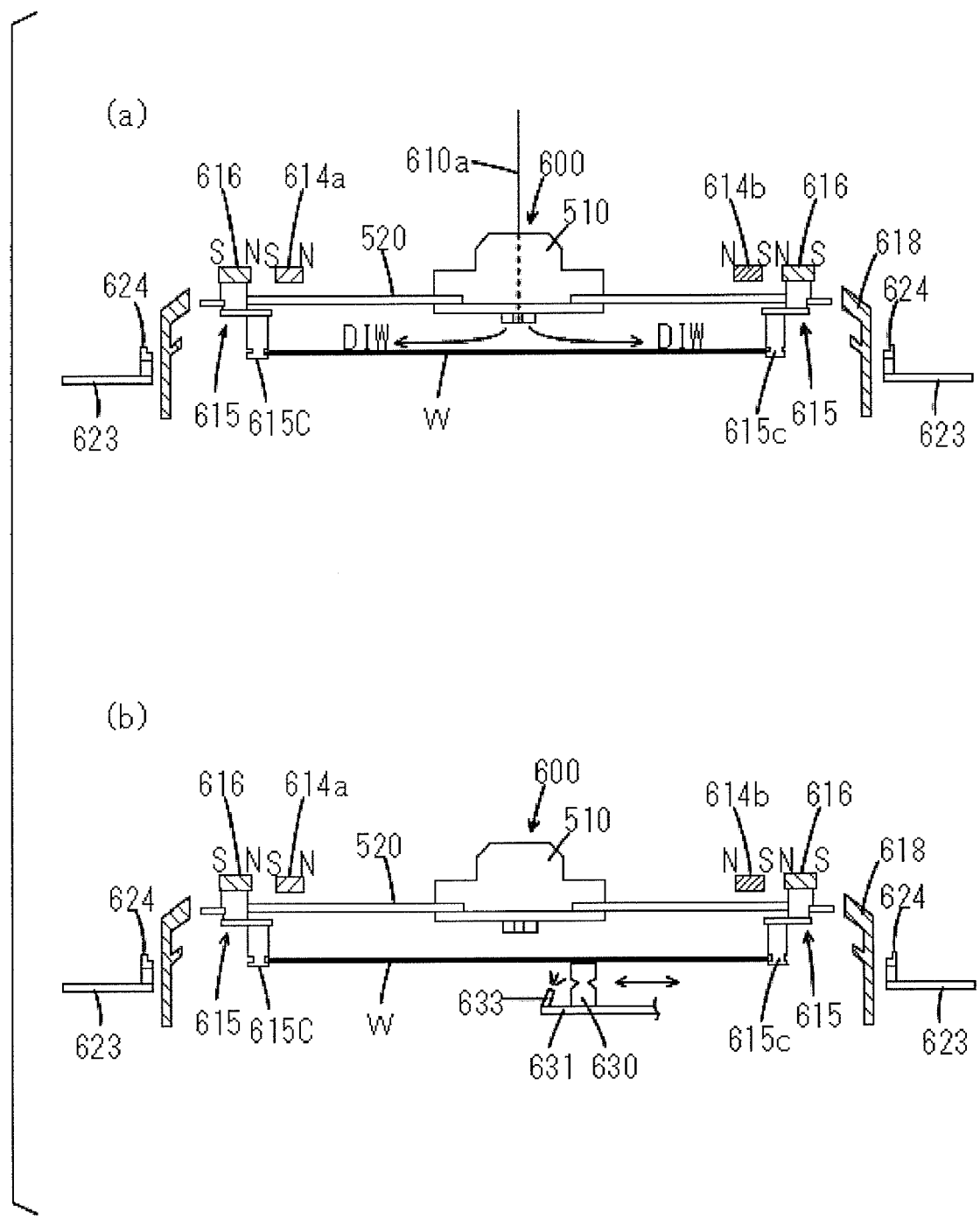
FIG. 11 is a side view for explaining top surface cleaning processing and back surface cleaning processing for a substrate.
Figure 12:
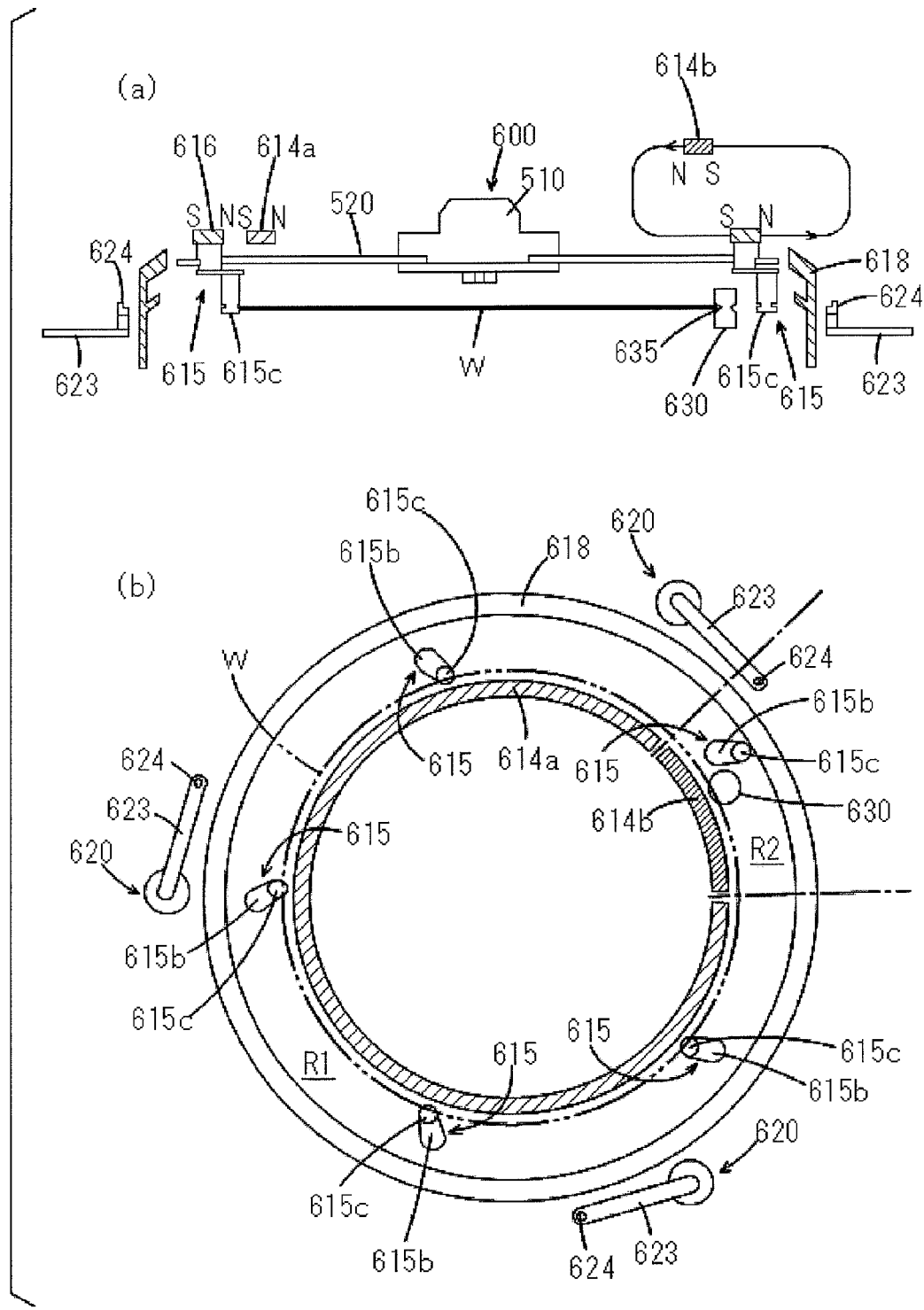
FIG. 12 is a side view and a plan view for explaining bevel cleaning processing for a substrate.

FIG. 11 is a side view for explaining the top surface cleaning processing and the back surface cleaning processing for the substrate W, and FIG. 12 is a side view and a plan view for explaining the bevel cleaning processing for the substrate W.

When the substrate W is subjected to the top surface cleaning processing, pure water DIW is supplied to the top surface of the substrate W through the fluid supply pipe 400 with the substrate W rotated by the spin chuck 600, as shown in FIG. 11(*a*). The pure water DIW spreads over the whole top surface of the substrate W by a centrifugal force, and is scattered outward. This causes particles and the like that adhere to the top surface of the substrate W to be washed away. Furthermore, a part of a component of the resist cover film on the substrate W is eluted in the pure water DIW and washed away.

When the substrate W is subjected to the back surface cleaning processing, the cleaning brush 630 moves to below the substrate W with the substrate W rotated by the spin chuck 600, as shown in FIG. 11(*b*). The cleaning brush 630 moves between a position below the center of the substrate W and a position below the peripheral portion thereof with the upper surface of the cleaning brush 630 and the back surface of the substrate W brought into contact with each other. The pure water is supplied from the cleaning nozzle 633 to a contact portion between the substrate W and the cleaning brush 630. This causes the whole back surface of the substrate W to be cleaned with the cleaning brush 630 while causing a contaminant that adheres to the back surface of the substrate W to be removed.

When the substrate W is subjected to the bevel cleaning processing, the magnet plate 614*a* is arranged at the lower position, and the magnet plate 614*b* is arranged at the upper position, as shown in FIGS. 12(*a*) and 12(*b*). In the state, the spin chuck 600 rotates the substrate W.

In this case, each of the chuck pins 615 enters a closed state in a region R1 outside the magnet plate 614*a* (see FIG. 12(*b*)), while entering an opened state in a region R2 outside the magnet plate 614*b* (see FIG. 12(*b*)). That is, the holder 615*c* in each of the chuck pins 615 is maintained in contact with the outer edge of the substrate W when it passes through the region R1 outside the magnet plate 614*a*, while being spaced apart from the outer edge of the substrate W when it passes through the region R2 outside the magnet plate 614*b*.

In this example, at least four of the five chuck pins 615 are positioned in the region R1 outside the magnet plate 614*a*. In this case, at least the four chuck pins 615 hold the substrate W. This causes the stability of the substrate W to be ensured.

In the state, the cleaning brush 630 moves to a position between the holder 615*c* in the chuck pin 615 and the outer edge of the substrate W in the region R2. The groove 635 of the cleaning brush 630 is abutted against the outer edge of the substrate W. The pure water is supplied from the cleaning nozzle 633 (FIG. 5) to the contact portion between the cleaning brush 630 and the substrate W. This causes the whole outer edge of the substrate W to be cleaned, causing a contaminant that adheres to the outer edge of the substrate W to be removed.

Note that the pure water may be supplied to the top surface of the substrate W through the fluid supply pipe 400 shown in FIG. 5 during the bevel cleaning processing. In the case, the bevel cleaning processing and the top surface cleaning processing can be simultaneously performed. Furthermore, a back surface cleaning brush for cleaning the back surface of the substrate W may be provided separately from the cleaning brush 630, and the back surface cleaning brush may be brought into contact with the back surface of the substrate W during the bevel cleaning processing. In the case, the bevel cleaning processing and the back surface cleaning processing can be simultaneously performed. Alternatively, the bevel cleaning processing, the top surface cleaning processing, and the back surface cleaning processing may be simultaneously performed.

The substrate W is subjected to the drying processing after the top surface cleaning processing, the back surface cleaning processing, and the bevel cleaning processing. In this case, the magnet plates 614a and 614b are arranged at the lower position, and all the chuck pins 615 hold the substrate W. In this state, the spin chuck 600 rotates the substrate W at high speed. This causes the pure water that adheres to the substrate W to be scattered, causing the substrate W to be dried.

Here, in the cleaning/drying processing unit SD1 shown in FIG. 5, it is possible to supply the pure water to the top surface of the substrate W from the fluid supply pipe 400 while supplying the $N_2$ gas thereto, as described above.

In the above-mentioned cleaning/drying processing unit SD1, the top surface of the substrate W may be subjected to cleaning processing and drying processing, as described below.

Figure 13:
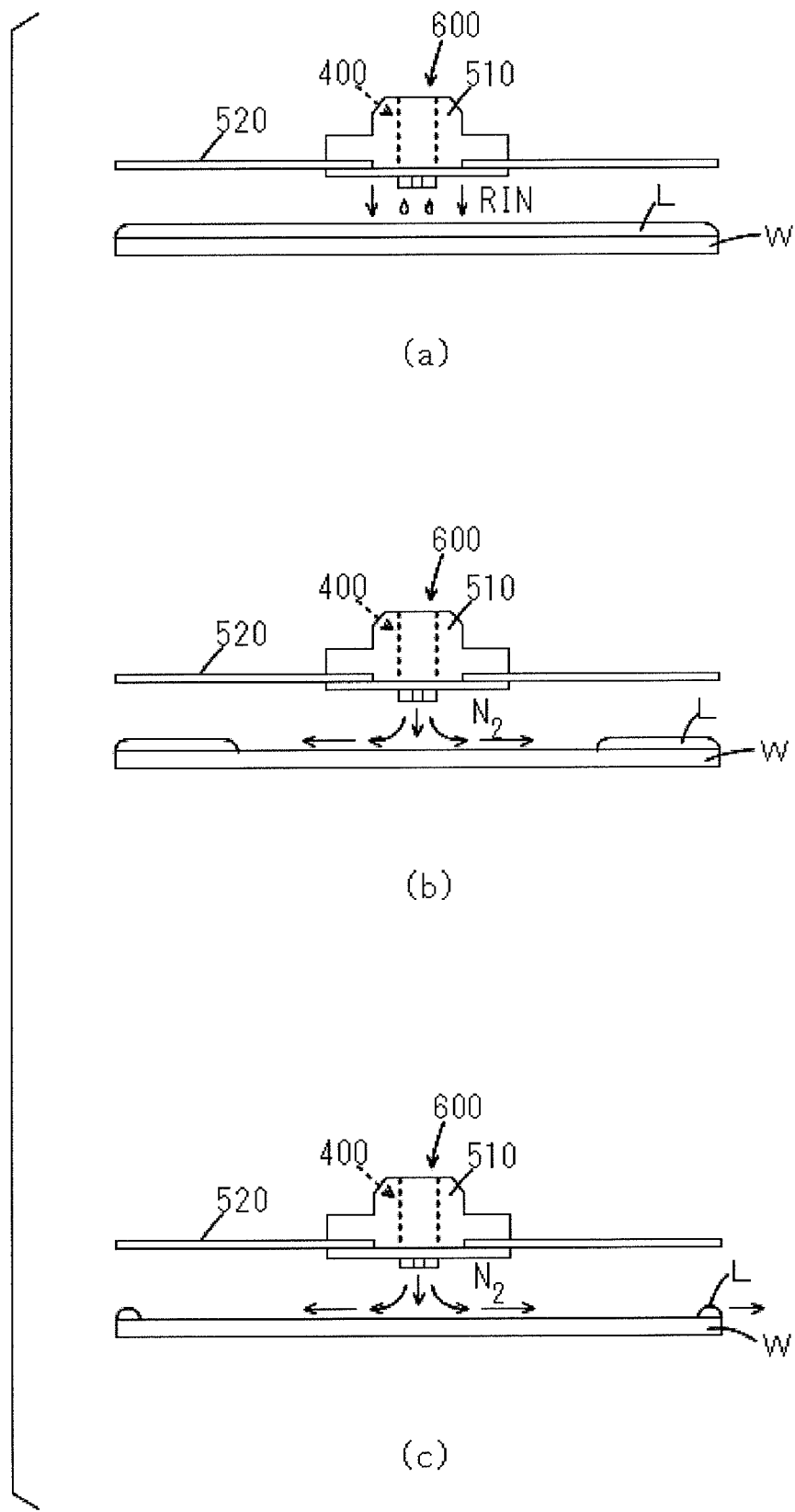
FIG. 13 is a diagram showing an example of cleaning processing and drying processing for a top surface of a substrate by the cleaning/drying processing unit shown in FIG. 5.

FIG. 13 is a diagram showing an example of the cleaning processing and the drying processing for the top surface of the substrate W by the cleaning/drying processing unit SD1 shown in FIG. 5.

Here, in this example, the cleaning liquid supply pipes 430 shown in FIG. 7 shall be connected to a cleaning liquid supply device (not shown) capable of supplying a rinse liquid. In this example, the rinse liquid means pure water or an immersion liquid used for exposure processing by means of a liquid immersion method in the exposure device 16, for example.

As described in the example of FIG. 11(a), the rinse liquid is first supplied to the top surface of the substrate W through the fluid supply pipe 400 with the substrate W rotated by the spin chuck 600. In this case, the rinse liquid spreads over the whole top surface of the substrate W by a centrifugal force, and is scattered outward. This causes the whole top surface of the substrate W to be washed away with the rinse liquid.

Thereafter, the rotation speed of the substrate W is reduced. This causes the amount of the rinse liquid that is scattered by the rotation of the substrate W to be reduced, causing a liquid layer L of a rinse liquid RIN to be formed on the whole top surface of the substrate W, as shown in FIG. 13(a). Note that the liquid layer L may be formed on the whole top surface of the substrate W by stopping the rotation of the substrate W.

Thereafter, $N_2$ gas is discharged from the fluid supply pipe 400, as shown in FIG. 13(b). This causes the rinse liquid RIN at the center of the substrate W to move to a peripheral portion of the substrate W, leaving the liquid layer L only in the peripheral portion of the substrate W, as shown in FIG. 13(c).

Then, a large centrifugal force is exerted on the liquid layer L on the substrate W by increasing the number of revolutions of the substrate W. This allows the liquid layer L on the substrate W to be reliably removed.

(7) Effects of Embodiment

As described in the foregoing, in the cleaning/drying processing units SD1 and SD2, the plurality of chuck pins 615 provided in the spin plate 520 hold the outer edge of the substrate W. The spin plate 520 is attached to the rotating shaft 210 through the plate supporting member 510. This causes the plate supporting member 510, together with the rotating shaft 210, to rotate by the spin motor 200 while causing the substrate W held by the plurality of chuck pins 615 on the plate supporting member 510 to rotate.

The guide pipe 410 made of stainless in the fluid supply pipe 400 is inserted through the rotating shaft 210 in the spin motor 200 and the plate supporting member 510. The guide pipe 410 is supported on the motor supporting member 200s that supports the spin motor 200 such that the gap GA is formed between the guide pipe 410 and an inner peripheral surface of the rotating shaft 210. The guide pipe 410 made of stainless has high rigidity. Even when the rotating shaft 210 rotates, therefore, the gap GA between the guide pipe 410 and the inner peripheral surface of the rotating shaft 210 is kept constant.

The gas supply pipe 420 and the plurality of cleaning liquid supply pipes 430 are inserted into the guide pipe 410. The cleaning liquid (pure water) is supplied to the top surface of the substrate W that rotates from respective discharge ports at the downstream ends of the plurality of cleaning liquid supply pipes 430. The gas ($N_2$ gas) is supplied to the top surface of the substrate W that rotates from a discharge port at the downstream end of the gas supply pipe 420. This causes the substrate W to be processed.

Inside the guide pipe 410, the gas supply pipe 420 is inserted into the center thereof. The plurality of cleaning liquid supply pipes 430 is inserted in contact with the outer peripheral surface of the gas supply pipe 420 and the inner peripheral surface of the guide pipe 410. Thus, the gas supply pipe 420 is positioned automatically and with high precision at the center of the inside of the guide pipe 410 by the plurality of cleaning liquid supply pipes 430. Furthermore, the plurality of cleaning liquid supply pipes 430 is positioned automatically and with high precision by the outer peripheral surface of the gas supply pipe 420 and the inner peripheral surface of the guide pipe 410. This allows the gas and the cleaning liquid to be supplied to the center of the top surface of the substrate W with high precision.

The guide pipe 410 is supported on the spin motor 200. Even when the spin motor 200 vibrates, therefore, the positional relationship between the rotating shaft 210 and the guide pipe 410 is held. This reliably prevents the guide pipe 410 from coming into contact with the rotating shaft 210.

Furthermore, the gas supply pipe 420 made of resin and the plurality of cleaning liquid supply pipes 430 made of resin have flexibility, so that the gas supply pipe 420 and the cleaning liquid supply pipes 430 can be easily inserted into the guide pipe 410. Since the gas supply pipe 420 and the plurality of cleaning liquid supply pipes 430 are thus inserted into the guide pipe 410, the fluid supply pipe 400 becomes compact. Therefore, it is possible to miniaturize the cleaning/drying processing units SD1 and SD2.

In addition, the fluid supply pipe 400 can be easily assembled on the cleaning/drying processing units SD1 and SD2 by attaching to the spin motor 200 the guide pipe 410 in which the gas supply pipe 420 and the cleaning liquid supply pipes 430 have been inserted. Therefore, it becomes possible to easily manufacture the cleaning/drying processing units SD1 and SD2.

In this case, the spin motor 200 is supported by the motor supporting member 200s, and the first flange FR1 of the guide pipe 410 is fixed to the motor supporting member 200s. This causes the guide pipe 410 to be reliably fixed to the spin motor 200 through the first flange FR1 and the motor supporting member 200s. Thus, attaching the first flange FR1 of the guide pipe 410 to the motor supporting member 200s allows the fluid supply pipe 400 to be easily fixed to the spin motor 200. Therefore, it becomes easier to manufacture the cleaning/drying processing units SD1 and SD2.

The guide pipe 410 and the plurality of supply pipes 420 and 430 provided inside the guide pipe 410 are fixed to each other by the supply pipe fixer 490. This prevents the positional relationship between the gas supply pipe 420 and the cleaning liquid supply pipes 430 from being shifted inside the guide pipe 410 when the fluid supply pipe 400 is attached to the cleaning/drying processing units SD1 and SD2.

Furthermore, the respective downstream ends of the gas supply pipe 420 and the plurality of cleaning liquid supply pipes 430 project from the downstream end of the guide pipe 410. This prevents the cleaning liquid supplied to the substrate W from the discharge ports at the downstream ends of the cleaning liquid supply pipes 430 from adhering to the guide pipe 410 made of stainless. This prevents the cleaning liquid that has adhered to the guide pipe 410 from causing metal contamination in the substrate W by dropping on the top surface of the substrate W.

As described above, the cleaning liquid can be supplied to the top surface of the substrate W that rotates from the plurality of cleaning liquid supply pipes 430. Therefore, it becomes possible to quickly supply a large amount of cleaning liquid to the substrate W. This allows the time period required to process the substrate W to be shortened.

Particularly, when the cleaning liquid is supplied to the top surface of the substrate W to form the liquid layer L (FIG. 13), a sufficient amount of cleaning liquid can be supplied onto the substrate W from the plurality of cleaning liquid supply pipes 430. This allows the time period required for the cleaning processing to be shortened.

Supplying the gas to the top surface of the substrate that rotates from the gas supply pipe 420 causes the cleaning liquid that adheres to the top surface of the substrate W to be quickly removed, allowing the substrate W to be sufficiently and reliably dried.

Here, the gas supply pipe 420 is positioned at the center of the inside of the guide pipe 410, and the guide pipe 410 is supported on the motor supporting member 200s such that the predetermined gap GA is formed between the guide pipe 410 and the inner peripheral surface of the rotating shaft 210. This causes the downstream end of the gas supply pipe 420 to be opposed to the rotation center of the substrate W. When the gas is supplied to the substrate W, therefore, the gas is reliably supplied to the rotation center of the substrate W from the gas supply pipe 420. Thus supplying the gas to the rotation center of the substrate W from the gas supply pipe 420 allows the cleaning liquid existing on the top surface of the substrate W to be reliably splashed outward from the substrate W.

In the present embodiment, the inner diameter of the gas supply pipe 420 is larger than the inner diameter of each of the plurality of cleaning liquid supply pipes 430. This allows a sufficient amount of gas to be supplied to the substrate W from the gas supply pipe 420.

Particularly in the present embodiment, in the cleaning/drying processing units SD1, the substrate W is subjected to the cleaning processing before exposure processing. This can prevent contamination in the exposure device 16 and can prevent a defective dimension and a defective shape of an exposure pattern.

When the substrate W is subjected to the top surface cleaning processing, a part of the component of the resist cover film on the substrate W is eluted in the cleaning liquid and washed away. This prevents, when a liquid is supplied onto the substrate W in the exposure device 16, the component of the resist cover film from being eluted in the liquid.

Furthermore, in the cleaning/drying processing units SD1 and SD2, spacing the holder 615c in the chuck pin 615 positioned in the region R2 apart from the outer edge of the substrate W while rotating the substrate W with the outer edge of the substrate W held by the holder 615c in the chuck pin 615 positioned in the region R1 allows the outer edge of the substrate W to be cleaned with the cleaning brush 630. In this case, the outer edge of the substrate W can be sufficiently cleaned without forming suction marks and the like on the back surface of the substrate W, unlike in a case where a suction type spin chuck that holds the back surface of the substrate W by vacuum suction is used.

In the cleaning/drying processing units SD1 and SD2, the spin chuck 600 is positioned above the substrate W. This allows the back surface of the substrate W to be cleaned with the cleaning brush 630, allowing a contaminant that adheres to the back surface of the substrate W to be reliably removed. Even when suction marks are formed on the back surface of the substrate W by the suction type spin chuck in the other units such as the coating unit RES, the suction marks can be reliably removed before the exposure processing. This can reliably prevent contamination in the exposure device 16 and defocusing caused by irregularities on the back surface of the substrate W.

Furthermore, in the cleaning/drying processing unit SD2, the substrate W is subjected to the cleaning processing after the exposure processing. In this case, even if particles and the like in an atmosphere adhere to the substrate W to which the liquid has adhered during the exposure processing, the attached impurities can be removed. This can reliably prevent processing defects in the substrate W. Furthermore, the substrate W after the exposure processing is kept clean, which can prevent development defects from occurring.

Figure 14:
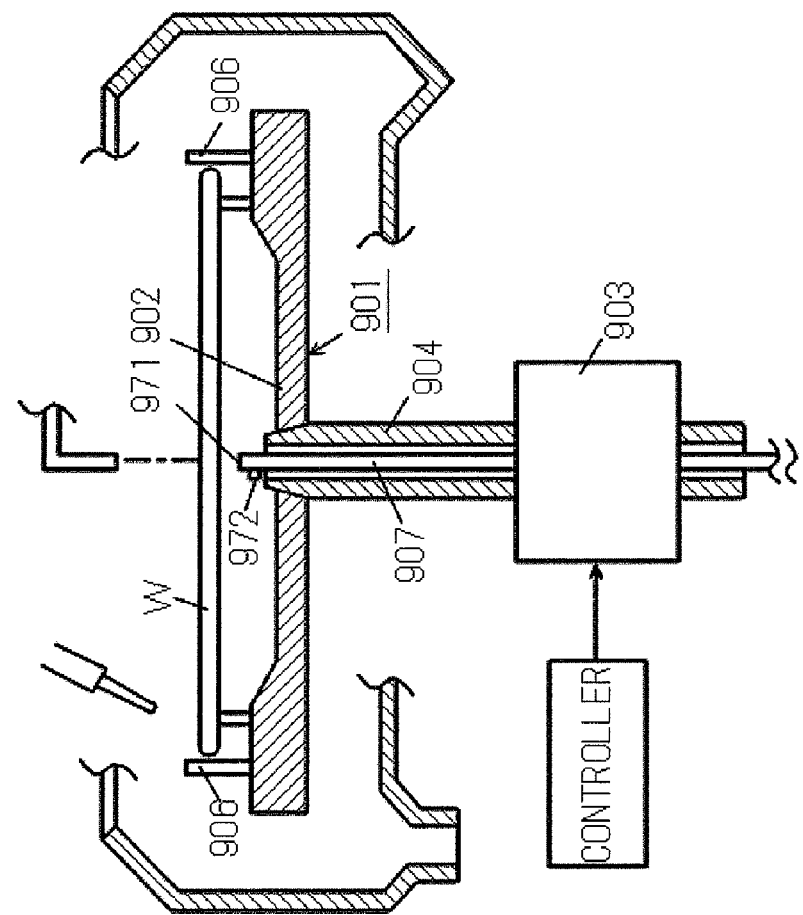
FIG. 14 is a schematic view showing the configuration of a substrate processing apparatus disclosed in JP 10-137664 A.

(8) Modified Example (8-1) The fluid supply pipe 400 can be used to clean not only the top surface (upper surface) of the substrate W but also the back surface (lower surface) of the substrate W. In this case, it becomes possible to supply a cleaning liquid and a gas to the back surface of the substrate W by inserting the fluid supply pipe 400 through a shaft 904 shown in FIG. 14 and fixing the fluid supply pipe 400 together with a motor 903. This allows the same effect as described above to be obtained.

(8-2) The cleaning/drying processing units SD1 and SD2 according to the above-mentioned embodiment can be also used as a chemical solution cleaning device that cleans a substrate using a chemical solution.

Description is herein made of an example of cleaning processing and drying processing for a top surface of a substrate using a chemical solution.

In this example, the cleaning liquid supply pipes 430 shown in FIG. 7 shall be connected to a cleaning liquid supply device (not shown) capable of supplying a chemical solution and a rinse liquid. In this example, the chemical solution means a solution such as BHF (buffered hydrofluoric acid), DHF (dilute hydrofluoric acid), hydrofluoric acid, hydrochloric acid, sulfuric acid, nitric acid, phosphoric acid, acetic acid, oxalic acid, a hydrogen peroxide solution, or ammonia, or their mixed solutions, for example. The rinse liquid means pure water, carbonated water, ozone water, magnetic water, regenerated water (hydrogen water), or ionic water, or an organic solvent such as IPA (isopropyl alcohol), for example.

First, the chemical solution is supplied to the top surface of the substrate W through the fluid supply pipe 400 with the substrate W rotated by the spin chuck 600. In this case, the chemical solution spreads over the whole top surface of the substrate W by a centrifugal force, and is scattered outward. This causes the whole top surface of the substrate W to be washed away with the chemical solution.

After an elapse of a predetermined time period, the supply of the chemical solution to the substrate W is stopped and the rinse liquid is supplied to the substrate W from the fluid supply pipe 400. This causes the chemical solution on the substrate W to be washed away.

Thereafter, the rotation speed of the substrate W is reduced. This causes the amount of the rinse liquid that is scattered by the rotation of the substrate W to be reduced, causing a liquid layer L of a rinse liquid RIN to be formed on the whole top surface of the substrate W (see FIG. 13(a)). Note that the liquid layer L may be formed on the whole top surface of the substrate W by stopping the rotation of the substrate W.

Thereafter, $N_2$ gas is discharged from the fluid supply pipe 400 (see FIG. 13(b)). This causes the rinse liquid RIN at the center of the substrate W to move to a peripheral portion of the substrate W, leaving the liquid layer L only in the peripheral portion of the substrate W (see FIG. 13(c)).

Then, a large centrifugal force is exerted on the liquid layer L on the substrate W by increasing the number of revolutions of the substrate W. This allows the liquid layer L on the substrate W to be reliably removed.

(8-3) Although description was made of the case where the guide pipe 410 in the fluid supply pipe 400 is formed of stainless steel, usable as a material forming the guide pipe 410 is a tough metal material such as iron, copper, bronze, brass, aluminum, silver, or gold in addition to stainless steel.

Although description was made of the case where the gas supply pipe 420 and the cleaning liquid supply pipe 430 are formed of fluororesin, usable as a material forming the gas supply pipe 420 and the cleaning liquid supply pipe 430 is a resin material having flexibility such as PVC (polyvinyl chloride), PPS (polyphenylene sulfide), PTFE (polytetrafluoroethylene), or PFA (tetrafluoroethylene-perfluoroalkylvinyl ether copolymer) in addition to fluororesin.

(8-4) Although the fluid supply pipe 400 is provided in each of the cleaning/drying processing units SD1 and SD2, a configuration including the fluid supply pipe 400 can be applied to the coating units BARC, RES, and COV, the development processing unit DEV, and the removal unit REM.

For example, in the development processing unit DEV having the same configuration as that of the cleaning/drying processing units SD1 and SD2, development processing is performed in the following manner, for example.

First, a development liquid is supplied onto the substrate W through the cleaning liquid supply pipes 430 with the substrate W not rotated or with the substrate W rotated at low revolutions. This causes a liquid layer of the development liquid to be formed on the top surface of the substrate W.

After an elapse of a predetermined time period, the substrate W is rotated at high revolutions while a gas is supplied from the gas supply pipe 420. This causes the liquid layer of the development liquid formed on the top surface of the substrate W to be reliably removed. Thus, the development processing is terminated.

Thereafter, the substrate W from which the development liquid has been removed may be carried into a processing unit having the same configuration as that of the cleaning/drying processing units SD1 and SD2 to subject the top surface of the substrate W after the development processing to cleaning processing and drying processing.

In the development processing unit DEV, the development processing and the drying processing may be performed in the following manner.

First, a development liquid is supplied to the substrate W from the cleaning liquid supply pipes 430, to form a liquid layer of the development liquid on the substrate W. After an elapse of a predetermined time period, a rinse liquid is supplied to the substrate W from the cleaning liquid supply pipes 430, to replace the development liquid on the substrate W with the rinse liquid. Thus, the development processing is reliably stopped. At this time, the liquid layer of the development liquid formed on the substrate W may be removed by rotating the substrate W.

Thereafter, the supply of the rinse liquid to the substrate W is stopped, to rotate the substrate W at high revolutions. Furthermore, the supply of the rinse liquid is stopped while a gas is supplied to the substrate W from the gas supply pipe 420. This causes the rinse liquid that adheres to the top surface of the substrate W to be reliably removed by the gas supplied from the gas supply pipe 420, causing the substrate W to be sufficiently dried.

(8-5) The respective numbers of cleaning/drying processing units SD1 and SD2, coating units BARC, RES, and COV, developing processing units DEV, removal units REM, heating units HP, cooling units CP, and placement/cooling units P-CP may be appropriately changed depending on the processing speed of each of the processing blocks.

Although in the first embodiment, the cleaning/drying processing units SD1 and SD2 are arranged in the interface block 15, at least one of the cleaning/drying processing units SD1 and SD2 may be arranged in the resist cover film removal block 14 shown in FIG. 1. Alternatively, a cleaning/drying processing block including at least one of the cleaning/drying processing units SD1 and SD2 may be provided between the resist cover film removal block 14 and the interface block 15 shown in FIG. 1.

Although in the present embodiment, description was made of a case where the exposure device 16 that subjects the substrate W to the exposure processing by means of the liquid immersion method is provided as a device external to the substrate processing apparatus 500, the present invention is not limited to the same. For example, an exposure device that subjects the substrate W to exposure processing without using a liquid may be provided as a device external to the substrate processing apparatus 500.

(8-6) Although in the above-mentioned embodiment, description was made of a case where the cleaning/drying processing units SD1 and SD2 are provided in the substrate processing apparatus 500, the present invention is not limited to the same. The cleaning/drying processing units SD1 and SD2 may be provided in other substrate processing apparatuses. Alternatively, the cleaning/drying processing units SD1 and SD2 may be used alone.

(9) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the preferred embodiments described above, the spin motor 200 is an example of a rotation-driving device, the plate supporting member 510 and the spin plate 520 are examples of a rotating member, the inner peripheral surface 51 Oh of the plate supporting member 510 is an example of an opening, and the chuck pin 615 is an example of a plurality of holding members.

The fluid supply pipe 400 is an example of a fluid supplying mechanism, the guide pipe 410 is an example of an outer pipe, the gas supply pipe 420 is an example of a first inner pipe, and the cleaning liquid supply pipe 430 is an example of a second inner pipe.

Furthermore, the motor fixer 290 is an example of a supporting member, the first flange FR1 is an example of a flange, and the gap GA is an example of a predetermined gap.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that subjects a substrate to predetermined processing, comprising:
   a rotation-driving device having a hollow rotating shaft extending in the vertical direction;
   a rotating member attached to the rotating shaft so as to rotate together with the rotating shaft and having an opening at its center;
   a plurality of holding members that are provided in the rotating member and hold an outer edge of the substrate; and
   a fluid supplying mechanism that supplies a first fluid and a second fluid to one surface of the substrate held by the plurality of holding members,
   wherein the fluid supplying mechanism comprises
   an outer pipe made of metal that is inserted through the rotating shaft of the rotation-driving device and the opening of the rotating member and is supported on the rotation-driving device such that a predetermined gap is formed between the outer pipe and an inner peripheral surface of the rotating shaft,
   a first inner pipe made of resin, which is inserted into the center of the inside of the outer pipe and has a discharge port at its end opposed to the one surface of the substrate, for supplying the first fluid to the substrate from the discharge port, and
   a plurality of second inner pipes made of resin, which are inserted into a portion of the outer pipe around the first inner pipe in contact with an outer peripheral surface of the first inner pipe and an inner peripheral surface of the outer pipe and the first inner pipe and the second inner pipe respectively have discharge ports at their ends opposed to the one surface of the substrate for supplying the second fluid to the substrate from the discharge ports.

2. The substrate processing apparatus according to claim 1, further comprising a supporting member that supports the rotation-driving device such that the rotating shaft extends in the vertical direction, wherein the outer pipe has a flange, and the flange is fixed to the supporting member.

3. The substrate processing apparatus according to claim 1, wherein:
   the outer pipe has an opening end opposed to the one surface of the substrate; and respective ends of the first inner pipe and the plurality of second inner pipes project from the opening end of the outer pipe.

4. The substrate processing apparatus according to claim 1, wherein:
   the first fluid is a gas, and
   the second fluid is a processing liquid.

5. The substrate processing apparatus according to claim 1, wherein the inner diameter of the first inner pipe is larger than the inner diameter of each of the plurality of second inner pipes.

* * * * *